US011532765B2

(12) United States Patent
Hwang et al.

(10) Patent No.: US 11,532,765 B2
(45) Date of Patent: Dec. 20, 2022

(54) SOLAR CELL AND SOLAR CELL PANEL INCLUDING THE SAME

(71) Applicant: Shangrao Jinko solar Technology Development Co., LTD

(72) Inventors: Sunghyun Hwang, Seoul (KR); Jinsung Kim, Seoul (KR); Hyunho Lee, Seoul (KR); Donghae Oh, Seoul (KR)

(73) Assignee: Shangrao Jinko solar Technology Development Co., LTD, Jiangxi Province (CN)

( * ) Notice: Subject to any disclaimer, the term of this patent is extended or adjusted under 35 U.S.C. 154(b) by 0 days.

(21) Appl. No.: 15/142,664

(22) Filed: Apr. 29, 2016

(65) Prior Publication Data

US 2016/0322527 A1 Nov. 3, 2016

(30) Foreign Application Priority Data

Apr. 30, 2015 (KR) .................. 10-2015-0061337
Sep. 11, 2015 (KR) .................. 10-2015-0129283

(51) Int. Cl.
*H01L 31/05* (2014.01)
*H01L 31/02* (2006.01)
(Continued)

(52) U.S. Cl.
CPC ...... *H01L 31/0508* (2013.01); *H01L 31/0201* (2013.01); *H01L 31/02366* (2013.01);
(Continued)

(58) Field of Classification Search
CPC ....... H01L 31/05–0516; H01L 31/0505; H01L 31/0201; H01L 31/022433;
(Continued)

(56) References Cited

U.S. PATENT DOCUMENTS

2011/0011454 A1    1/2011  Taira et al.
2011/0174355 A1*   7/2011  Biro ............... H01L 31/022441
                                                          136/244
(Continued)

FOREIGN PATENT DOCUMENTS

CN       103943695 A    7/2014
JP       2000-261012 A  9/2000
(Continued)

OTHER PUBLICATIONS

Machine translation of JP3188069U, retrieved Nov. 30, 2017.*

*Primary Examiner* — Michael Y Sun
(74) *Attorney, Agent, or Firm* — Pillsbury Winthrop Shaw Pittman LLP; Chad J. Hammerlind

(57) ABSTRACT

A solar cell panel is disclosed. The disclosed solar cell panel includes a semiconductor substrate, a conductive region disposed in or on the semiconductor substrate, an electrode connected to the conductive region, a lead electrically connected to the electrode. The electrode includes finger lines, and a bus bar line extending across the finger lines, and electrically connected to the lead. First and second end edge areas are arranged at opposite ends of the bus bar line disposed adjacent to opposite edges of the semiconductor substrate, respectively. The bus bar line includes electrode portions respectively disposed at the first end second end edge areas. Each electrode portion includes an opening formed through the each electrode portion, and an outermost end disposed at a position flush with corresponding ones of the outermost ones of the finger lines or a position outwards of the corresponding outermost finger lines.

19 Claims, 15 Drawing Sheets

(51) Int. Cl.
*H01L 31/0224* (2006.01)
*H01L 31/0236* (2006.01)
*H01L 31/048* (2014.01)
*H01L 31/068* (2012.01)
*H01L 31/046* (2014.01)
*H01L 31/0465* (2014.01)

(52) U.S. Cl.
CPC .. *H01L 31/022433* (2013.01); *H01L 31/0488* (2013.01); *H01L 31/068* (2013.01); *H01L 31/02013* (2013.01); *H01L 31/0224* (2013.01); *H01L 31/046* (2014.12); *H01L 31/0465* (2014.12); *H01L 31/05* (2013.01); *Y02E 10/547* (2013.01)

(58) Field of Classification Search
CPC ........... H01L 31/02366; H01L 31/0488; H01L 31/0508; H01L 31/068; H01L 31/02013; H01L 31/0224; H01L 31/046; H01L 31/0465; Y02E 10/547
See application file for complete search history.

(56) References Cited

U.S. PATENT DOCUMENTS

| | | | | |
|---|---|---|---|---|
| 2012/0042925 | A1* | 2/2012 | Pfennig | H01L 31/0508 136/244 |
| 2012/0138141 | A1* | 6/2012 | Kim | H01L 31/022433 136/256 |
| 2013/0104956 | A1* | 5/2013 | Chou | H01L 31/022433 136/244 |
| 2013/0167910 | A1* | 7/2013 | DeGroot | H01L 31/0481 136/251 |
| 2013/0305528 | A1* | 11/2013 | Anderson | H02J 7/0052 29/825 |
| 2013/0306129 | A1* | 11/2013 | Tohoda | H01L 31/0508 136/244 |
| 2014/0166081 | A1* | 6/2014 | Lai | H01L 31/022433 136/251 |
| 2014/0174522 | A1 | 6/2014 | Yang et al. | |
| 2016/0163888 | A1* | 6/2016 | Reddy | H01L 31/022433 136/256 |

FOREIGN PATENT DOCUMENTS

| | | |
|---|---|---|
| JP | 2003-258277 A | 9/2003 |
| JP | 2011-517118 A | 5/2011 |
| JP | 2012-129359 A | 7/2012 |
| JP | 2013-51452 A | 3/2013 |
| JP | 3188069 U * | 12/2013 |
| JP | 2014-60311 A | 4/2014 |
| JP | 2015-5754 A | 1/2015 |
| JP | 2015-70260 A | 4/2015 |
| KR | 10-2010-0124715 A | 11/2010 |
| KR | 10-2012-0062431 A | 6/2012 |

* cited by examiner (a)

(b)

(a)

(b)

(a)

(b)

(a)

(b)

SOLAR CELL AND SOLAR CELL PANEL INCLUDING THE SAME

CROSS-REFERENCE TO RELATED APPLICATIONS

This application claims the priority benefit of Korean Patent Application No. 10-2015-0061337 filed on Apr. 30, 2015 and Korean Patent Application No. 10-2015-0129283 filed on Sep. 11, 2015 in the Korean Intellectual Property Office, the disclosures of which are incorporated herein by reference.

BACKGROUND OF THE INVENTION

1. Field of the Invention

Embodiments of the present invention relate to a solar cell and a solar cell panel including the same, and more particularly to solar cells connected by leads and a solar cell panel including the same.

2. Description of the Related Art

Recently, as existing energy resources such as petroleum and coal are depleted, interest in alternative energy sources is increasing. For example, a solar cell is highlighted as a next-generation cell capable of converting solar energy into electric energy A plurality of solar cells as mentioned above is connected in series or in parallel by a plurality of ribbons, and is then packaged through a packaging process, for protection thereof, thereby forming a solar cell panel. Since such a solar cell panel must perform electricity generation for a long period of time in various environments, the solar cell panel should secure long-term reliability. In conventional instances, a plurality of solar cells is connected by ribbons, as mentioned above.

However, when solar cells are connected using ribbons having a great width of about 1.5 mm, shading loss may be generated due to such a great width of the ribbons. For this reason, the number of ribbons used for the solar cells should be reduced. Furthermore, the ribbons exhibit inferior attachment strength, or the solar cells may exhibit an increased degree of bending due to the ribbons. In such a case, there is a limitation in enhancing the output power of the solar cell panel. In addition, the ribbons may be detached from the solar cells, or the solar cells may be damaged. As a result, the solar cell panel may exhibit decreased reliability.

Although an improvement in electrode structure may be proposed to eliminate the above-mentioned problems, the resultant solar cells may exhibit degraded efficiency in this instance and, as such, the output power of the resultant solar cell panel may be degraded.

SUMMARY OF THE INVENTION

Therefore, the embodiments of the present invention have been made in view of the above problems, and it is an object of the embodiments of the present invention to provide a solar cell capable of enhancing the output power and reliability of a solar cell panel, and a solar cell panel including the same.

In accordance with an aspect of the present invention, the above and other objects can be accomplished by the provision of a solar cell panel including a solar cell including a semiconductor substrate, a conductive region formed in or on the semiconductor substrate, and an electrode connected to the conductive region, and at least one lead electrically connected to the electrode, to connect the solar cell to another solar cell or an external circuit, wherein the electrode includes a plurality of finger lines formed to extend in parallel in a first direction and including outermost finger lines of the plurality of finger lines that are respectively disposed adjacent to opposite edges of the semiconductor substrate, and including a bus bar line formed to extend in a second direction crossing the first direction, and electrically connected to the at least one lead, wherein a first end edge area is arranged at one end of the bus bar line disposed adjacent to one edge of the opposite edges of the semiconductor substrate, and a second end edge area is arranged at the other end of the bus bar line disposed adjacent to the other edge of the opposite edges of the semiconductor substrate, wherein the bus bar line includes electrode portions respectively disposed at the first and second end edge areas, and each electrode portion of the electrode portions includes an opening formed through an electrode portion, and an outermost end disposed at a position flush with corresponding ones of the outermost finger lines or a position outwards of the corresponding outermost finger lines.

In accordance with another aspect of the present invention, there is provided a solar cell including a semiconductor substrate, a conductive region formed in or on the semiconductor substrate, and an electrode connected to the conductive region, wherein the electrode includes a plurality of finger lines formed to extend in parallel in a first direction while including outermost finger lines disposed adjacent to opposite edges of the semiconductor substrate, and a bus bar line formed to extend in a second direction crossing the first direction, and electrically connected to a lead to connect the solar cell to another solar cell or an external circuit, wherein a first end edge area is arranged at one end of the bus bar line disposed adjacent to one edge of the semiconductor substrate, and a second end edge area is arranged at the other end of the bus bar line disposed adjacent to the other edge of the semiconductor substrate, and wherein the bus bar line includes electrode portions respectively disposed at the first end second end edge areas, and each of the electrode portions includes an opening formed through the electrode portion, and an outermost end disposed at a position flush with corresponding ones of the outermost finger lines or a position outwards of the corresponding outermost finger lines.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
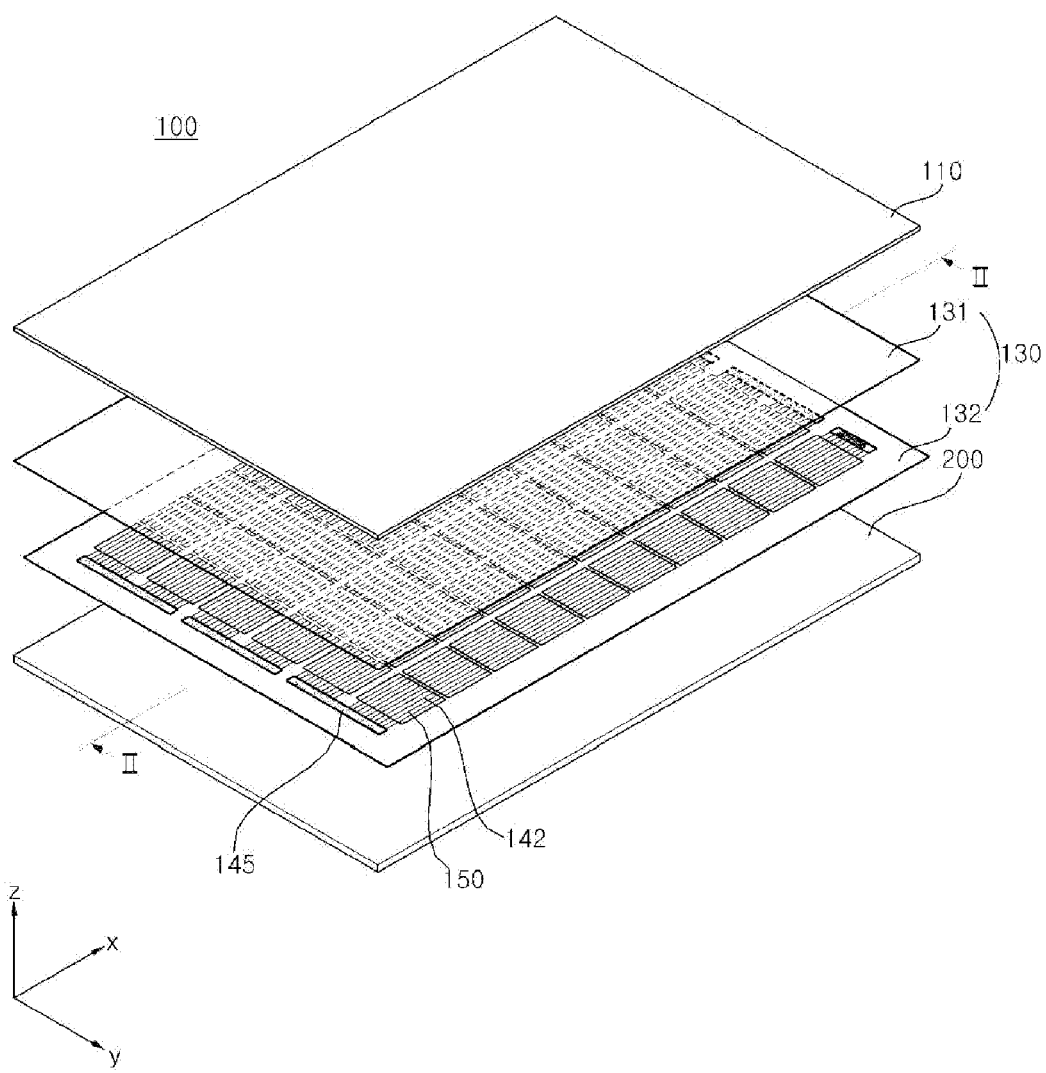
FIG. 1 is a perspective view illustrating a solar cell panel according to an embodiment of the present invention.

Reference will now be made in detail to the example embodiments of the present invention, examples of which are illustrated in the accompanying drawings. The present invention may, however, be embodied in many alternate forms and should not be construed as limited to the embodiments set forth herein.

In the drawings, illustration of parts having no concern with the embodiments of the present invention is omitted for clarity and simplicity of description. The same reference numerals designate the same or very similar elements throughout the specification. In the drawings, the thicknesses, widths or the like of elements are exaggerated or reduced for clarity of description, and should not be construed as limited to those illustrated in the drawings.

It will be understood that the terms "comprises" and/or "comprising," or "includes" and/or "including" when used in the specification, specify the presence of stated matters, but do not preclude the presence or addition of one or more other matters. In addition, it will be understood that, when an element such as a layer, film, region, or plate is referred to as being "on" another element, it can be directly disposed on another element or can be disposed such that an intervening element is also present therebetween. Accordingly, when an element such as a layer, film, region, or plate is disposed "directly on" another element, this means that there is no intervening element between the two elements.

Hereinafter, solar cells and solar cell panels including the same according to embodiments of the present invention will be described in detail with reference to the accompanying drawings.

Figure 2:
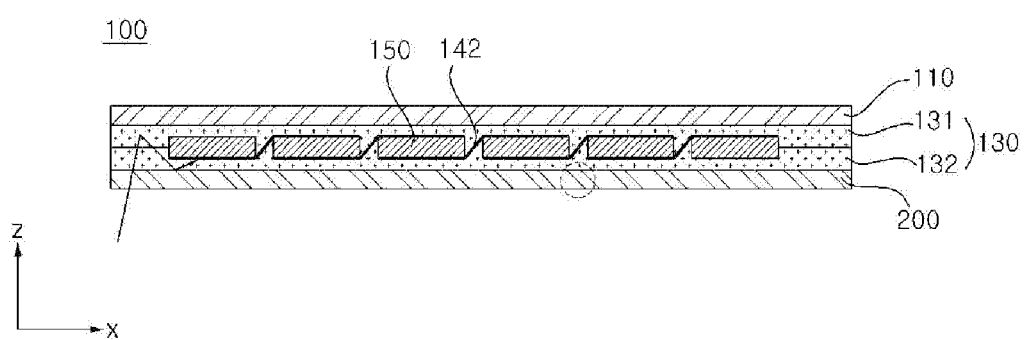
FIG. 2 is a cross-sectional view taken along line II-II in FIG. 1.

FIG. 1 is a perspective view illustrating a solar cell panel according to an embodiment of the present invention. FIG. 2 is a cross-sectional view taken along line II-II in FIG. 1.

Referring to FIGS. 1 and 2, the solar cell panel according to the illustrated embodiment, which is designated by reference numeral "100", includes a plurality of solar cells 150, and leads (or interconnectors) 142 for electrically connecting the solar cells 150. The solar cell panel 100 also includes a sealant 130 for enclosing and sealing the solar cells 150 and leads 142, a front substrate 110 disposed at a front side of the solar cells 150 over the sealant 130, and a back substrate 200 disposed at a backside of the solar cells 150 over the sealant 130. This will be described in more detail.

First, each solar cell 150 may include a photoelectric converter for converting solar energy into electric energy, and an electrode electrically connected to the photoelectric converter, to collect current, for transfer of the collected current. The solar cells 150 may be electrically connected in series, in parallel, or in series-parallel by the leads 142. In detail, longitudinally neighboring ones of the solar cells 150 are electrically connected by corresponding ones of the leads 142 and, as such, the solar cells 150 form strings extending in the longitudinal direction.

Bus ribbons 145 connect opposite ends of the solar cell strings, in detail, ends of the leads 142 thereof, in an alternating manner. The bus ribbons 145 may be arranged at opposite ends of the solar cell strings, to extend in a direction crossing the solar cell strings. The bus ribbons 145 may connect adjacent ones of the solar cell strings, or connect the solar cell strings to a junction box for preventing backward flow of current. The material, shape, and connecting structure of the bus ribbons 145 may be diverse and, as such, the embodiment of the present invention is not limited thereto.

The sealant 130 may include a first sealant 131 disposed at the front side of the solar cells 150, and a second sealant 132 disposed at the backside of the solar cells 150. The first sealant 131 and second sealant 132 block permeation of moisture or oxygen, which may adversely affect the solar cells 150, and enable chemical coupling of components of the solar cell panel 100. The solar cell panel 100 may have an integrated structure. This may be achieved by arranging the back substrate 200, second sealant 132, solar cells 150, first sealant 131 and front substrate 110 in this order, and then applying heat and/or pressure or the like to the resultant structure through a lamination process.

As the first sealant 131 and second sealant 132, ethylene vinyl acetate (EVA) copolymer resin, polyvinyl butyral, silicon resin, ester-based resin, olefin-based resin, or the like may be used. Of course, the embodiment of the present invention is not limited to such materials. Accordingly, the first and second sealants 131 and 132 may be formed, using various other materials, in accordance with a method other than lamination. In this instance, the first and second sealants 131 and 132 have optical transparency, to allow light incident through the back substrate 200 or light reflected from the back substrate 200 to reach the solar cells 150.

The front substrate 110 is disposed on the first sealant 131 and, as such, constitutes a front surface of the solar cell panel 100. The front substrate 110 may be made of a material having a strength capable of protecting the solar cells 150 from external impact or the like and optical transparency capable of allowing transmission of light such as sunlight. For example, the front substrate 110 may be constituted by a glass substrate or the like. In this instance, the front substrate 110 may be constituted by a reinforced glass substrate, for strength enhancement. In addition, various variations may be applied to the front substrate 110. For example, the front substrate 110 may additionally contain various materials capable of improving various characteristics. Alternatively, the front substrate 110 may be a sheet or film made of resin or the like. That is, the embodiment of the present invention is not limited as to the material of the front substrate 110, and the front substrate 110 may be made of various materials.

The back substrate 200 is a layer disposed on the second sealant 132, to protect the solar cells 150 at the backside thereof. The back substrate 200 may have waterproof, insulation, and ultraviolet blocking functions.

The back substrate 200 may have a strength capable of protecting the solar cells 150 from external impact or the like. The back substrate 200 may also have characteristics allowing transmission of light or reflection of light in accordance with a desired structure of the solar cell panel 150. For example, in a structure of the solar cell panel 150, in which light is incident through the back substrate 200, the back substrate 200 may be made of a transparent material. On the other hand, in a structure of the solar cell panel 150, in which light is reflected by the back substrate 200, the back substrate 200 may be made of an opaque material, a reflective material, or the like. For example, the back substrate 200 may have a substrate structure made of glass. Alternatively, the back substrate 200 may have a film or sheet structure or the like. For example, the back substrate 200 may be of Tedlar/PET/Tedlar (TPT) type or may have a structure in which polyvinylidene fluoride (PVDF) resin or the like is formed over at least one surface of polyethylene terephthalate (PET). PVDF, which is a polymer having a structure of $(CH_2CF_2)n$, has a double fluorine molecular structure and, as such, has excellent mechanical properties, weather resistance and ultraviolet resistance. However, the embodiment of the present invention is not limited to the material of the back substrate 200.

Hereinafter, an example of one solar cell included in the solar cell panel according to the illustrated embodiment of the present invention will be described in more detail with reference to FIG. 3.

Figure 3:
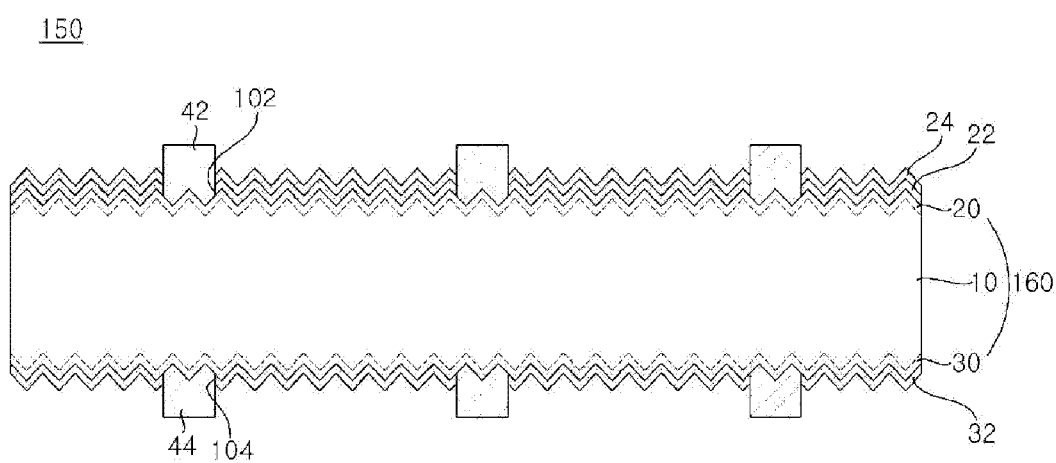
FIG. 3 is a sectional view illustrating an example of the solar cell included in the solar cell panel of FIG. 1.

FIG. 3 is a sectional view illustrating an example of the solar cell included in the solar cell panel of FIG. 1.

Referring to FIG. 3, the solar cell 150 according to the illustrated embodiment includes a semiconductor substrate 160 including a base region 10, conductive regions 20 and 30 formed in the semiconductor substrate 160 or on the semiconductor substrate 160, and electrodes 42 and 44 respectively connected to the conductive regions 20 and 30. In this instance, the conductive regions 20 and 30 may include a first-conduction-type conductive region 20 having a first conductivity and a second-conduction-type conductive region 30 having a second conductivity. The electrodes 42 and 44 may include a first electrode 42 connected to the first-conduction-type conductive region 20 and a second electrode 44 connected to the second-conduction-type conductive region 30. The solar cell 150 may further include a first passivation film 22, an anti-reflective film 24, a second passivation film 32, etc.

The semiconductor substrate 160 may be made of crystalline semiconductor. For example, the semiconductor substrate 160 may be made of a single-crystalline or polycrystalline semiconductor (for example, a single-crystalline or polycrystalline silicon). For example, the semiconductor substrate 160 may be made of a single-crystalline semiconductor (for example, a single-crystalline semiconductor wafer, for example, a single-crystalline silicon wafer). When the semiconductor substrate 160 is made of a single-crystalline semiconductor (for example, a single-crystalline silicon), the solar cell 150 exhibits reduced defects because the solar cell 150 is based on the semiconductor substrate 160, which has high crystallinity. Thus, the solar cell 150 may have excellent electrical characteristics.

The front and/or back surface of the semiconductor substrate 160 may have an uneven surface structure having protrusions and grooves through texturing. For example, the protrusions and grooves have a pyramid shape having an outer surface constituted by a (111)-oriented surface of the semiconductor substrate 160 while having an irregular size. For example, when the front surface of the semiconductor substrate 160 has increased surface roughness in accordance with formation of protrusions and grooves through texturing, it may be possible to reduce reflectance of light incident through the front surface of the semiconductor substrate 160. Accordingly, an amount of light reaching a pn junction formed by the base region 10 and first-conduction-type conductive region 20 may be increased and, as such, shading loss may be minimized. However, the embodiment of the present invention is not limited to the above-described structure. The semiconductor substrate 160 may not have, at the front and back surfaces thereof, protrusions and grooves formed through texturing.

The base region 10 of the semiconductor substrate 160 may be doped with a second-conduction-type dopant at a relatively low doping concentration and, as such, has the second conductivity. For example, the base region 10 may be arranged farther from the front surface of the semiconductor substrate 160 or closer to the back surface of the semiconductor substrate 160 than the first-conduction-type conductive region 20. In addition, the base region 10 may be arranged closer to the front surface of the semiconductor substrate 160 or farther from the back surface of the semiconductor substrate 160 than the second-conduction-type conductive region 30. Of course, the embodiment of the present invention is not limited to such an arrangement, and the location of the base region 10 may be varied.

In this instance, the base region 10 may be made of a crystalline semiconductor containing a second-conduction-type dopant, for example, a single-crystalline or polycrystalline semiconductor (for example, a single-crystalline or polycrystalline silicon) containing a second-conduction-type dopant. For example, the base region 10 may be made of a single-crystalline semiconductor (for example, a single-crystalline semiconductor wafer, for example, a single-crystalline silicon wafer) containing a second-conduction-type dopant.

The second conduction type may be an n-type or a p-type. When the base region 10 has n-type conductivity, the base region 10 may be made of a single-crystalline or polycrystalline semiconductor doped with a Group-V element such as phosphorous (P), arsenic (As), bismuth (Bi) or antimony (Sb). On the other hand, when the base region 10 has p-type conductivity, the base region 10 may be made of a single-crystalline or polycrystalline semiconductor doped with a Group-III element such as boron (B), aluminum (Al), gallium (Ga), or indium (In).

Of course, the embodiment of the present invention is not limited to the above-described materials, and the base region 10 and second-conduction-type dopant may be constituted by various materials.

For example, the base region 10 may have n-type conductivity. Then, the first-conduction-type conductive region 20, which forms a pn junction together with the base region 10, has p-type conductivity. When light is irradiated to such a pn junction, electrons produced in accordance with a photoelectric effect migrate toward the back surface of the semiconductor substrate 160 and, as such, are collected by the second electrode 44. Meanwhile, holes migrate toward the front surface of the semiconductor substrate 160 and, as such, are collected by the first electrode 42. As a result, electric energy is generated. Then, holes having a lower movement rate than electrons migrate toward the front surface of the semiconductor substrate 160, rather than the back surface of the semiconductor substrate 160 and, as such, photoelectric conversion efficiency may be enhanced. Of course, the embodiment of the present invention is not limited to the above-described conditions, and the base region 10 and second-conduction-type conductive region 30 may have p-type conductivity, and the first-conduction-type conductive region 20 may have n-type conductivity.

The first-conduction-type conductive region 20, which has the first conductivity opposite that of the base region 10, may be formed at the front surface side of the semiconductor substrate 160. The first-conduction-type conductive region 20 forms a pn junction together with the base region 10 and, as such, constitutes an emitter region to produce carriers in accordance with a photoelectric effect.

In the illustrated embodiment, the first-conduction-type conductive region 20 may be constituted by a doped region constituting a portion of the semiconductor substrate 160. In this instance, the first-conduction-type conductive region 20 may be made of a crystalline semiconductor containing a first-conduction-type dopant. For example, the first-conduction-type conductive region 20 may be made of a single-crystalline or polycrystalline semiconductor (for example, a single-crystalline or polycrystalline silicon) containing a first-conduction-type dopant. For example, the first-conduction-type conductive region 20 may be made of single-crystalline semiconductor (for example, a single-crystalline semiconductor wafer, for example, a single-crystalline silicon wafer) containing a first-conduction-type dopant. When the first-conduction-type conductive region 20 constitutes a portion of the semiconductor substrate 160, as described above, junction characteristics of the base region 10 and first-conduction-type conductive region 20 may be enhanced.

Of course, the embodiment of the present invention is not limited to the above-described conditions and, the first-conduction-type conductive region 20 may be formed on the semiconductor substrate 160, separately from the semiconductor substrate 160. In this instance, the first-conduction-type conductive region 20 may be constituted by a semiconductor layer having a crystalline structure different from that of the semiconductor substrate 160, for easy formation thereof on the semiconductor substrate 160. For example, the first-conduction-type conductive region 20 may be formed by doping an amorphous semiconductor, microcrystalline semiconductor, or polycrystalline semiconductor (for example, an amorphous silicon, microcrystalline silicon, or polycrystalline silicon), which may be easily manufactured through various methods such as deposition, with a first-conduction-type dopant. Of course, other variations are possible.

The first-conduction-type may be p-type or n-type. When the first-conduction-type conductive region 20 has p-type conductivity, the first-conduction-type conductive region 20 may be made of a single-crystalline or polycrystalline semiconductor doped with a Group-III element such as boron (B), aluminum (Al), gallium (Ga), or indium (In). On the other hand, when the first conduction type conductive region has n-type conductivity, the first-conduction-type conductive region 20 may be made of a single-crystalline or polycrystalline semiconductor doped with a Group-V element such as phosphorous (P), arsenic (As), bismuth (Bi) or antimony (Sb). For example, the first-conduction-type conductive region 20 may be a single-crystalline or polycrystalline semiconductor doped with boron. Of course, the embodiment of the present invention is not limited to the above-described materials, and various materials may be used as the first-conduction-type dopant.

In the drawings, the first-conduction-type conductive region 20 is illustrated as having a homogeneous structure having a uniform doping concentration throughout the first-conduction-type conductive region 20. Of course, the embodiment of the present invention is not limited to the above-described structure. In another embodiment, the first-conduction-type conductive region 20 may have a selective structure, as illustrated in FIG. 4.

Figure 4:
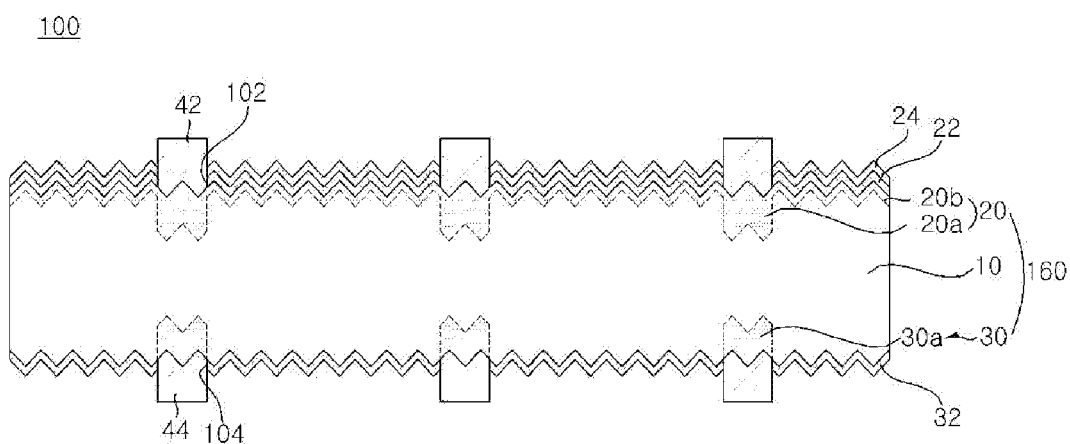
FIG. 4 is a sectional view illustrating another example of the solar cell included in the solar cell panel of FIG. 1.

Referring to FIG. 4, the first-conduction-type conductive region 20, which has a selective structure, may include a first portion 20a formed adjacent to the first electrode 42, to contact the first electrode 42, and a second portion 20b formed at the remaining portion of the first-conduction-type conductive region 20, for example, a portion of the first-conduction-type conductive region 20, except for the first portion 20a.

The first portion 20a may have a high doping concentration and, as such, may have relatively low resistance. The second portion 20b may have a lower doping concentration than the first portion 20a and, as such, may have relatively high resistance. The first portion 20a may have a greater thickness than the second portion 20b. That is, the junction depth of the first portion 20a may be greater than that of the second portion 20b.

Thus, in the illustrated embodiment, a shallow emitter is realized by forming the second portion 20b having relatively high resistance at a portion of the first-conduction-type conductive region 20, except for the first portion 20a corresponding to the first electrode 42, upon which light is incident. Accordingly, the current density of the solar cell 150 may be enhanced. In addition, it may be possible to reduce contact resistance of the first-conduction-type conductive region 20 to the first electrode 42 by forming the first portion 20a having a relatively low resistance at a portion of the first-conduction-type conductive region 20 adjacent to the first electrode 42. Accordingly, maximal efficiency may be achieved.

The first-conduction-type conductive region 20 may have various structures and various shapes other than the above-described structures and shapes.

Again referring to FIG. 3, the second-conduction-type conductive region 30, which has the second conductivity identical to that of the base region 10 while having a higher doping concentration than the base region 10, may be formed at the back surface side of the semiconductor substrate 160. The second-conduction-type conductive region 30 forms a back surface field region, which generates a back surface field, to prevent loss of carriers caused by re-coupling (or recombination) thereof at a surface of the semiconductor substrate 160 (for example, the back surface of the semiconductor substrate 160).

In the illustrated embodiment, the second-conduction-type conductive region 30 may be constituted by a doped region constituting a portion of the semiconductor substrate 160. In this instance, the second-conduction-type conductive region 30 may be made of a crystalline semiconductor containing a second-conduction-type dopant. For example, the second-conduction-type conductive region 30 may be made of a single-crystalline or polycrystalline semiconductor (for example, a single-crystalline or polycrystalline silicon) containing a second-conduction-type dopant. For example, the second-conduction-type conductive region 30 may be made of single-crystalline semiconductor (for example, a single-crystalline semiconductor wafer, for example, a single-crystalline silicon wafer) containing a second-conduction-type dopant. When the second-conduction-type conductive region 30 constitutes a portion of the semiconductor substrate 160, as described above, junction characteristics of the base region 10 and second-conduction-type conductive region 30 may be enhanced.

Of course, the embodiment of the present invention is not limited to the above-described conditions and, the second-conduction-type conductive region 30 may be formed on the semiconductor substrate 160, separately from the semiconductor substrate 160. In this instance, the second-conduction-type conductive region 30 may be constituted by a semiconductor layer having a crystalline structure different from that of the semiconductor substrate 160, for easy formation thereof on the semiconductor substrate 160. For example, the second-conduction-type conductive region 30 may be formed by doping an amorphous semiconductor, microcrystalline semiconductor, or polycrystalline semiconductor (for example, an amorphous silicon, microcrystalline silicon, or polycrystalline silicon), which may be easily manufactured through various methods such as deposition, with a second-conduction-type dopant. Of course, other variations are possible.

The second-conduction-type may be an n-type or a p-type. When the second-conduction-type conductive region 30 has n-type conductivity, the second-conduction-type conductive region 30 may be made of a single-crystalline or polycrystalline semiconductor doped with a Group-V element such as phosphorous (P), arsenic (As), bismuth (Bi) or antimony (Sb). On the other hand, the second conduction type has p-type conductivity, the second-conduction-type conductive region 30 may be made of a single-crystalline or polycrystalline semiconductor doped with a Group-III element such as boron (B), aluminum (Al), gallium (Ga), or indium (In). For example, the second-conduction-type conductive region 30 may be a single-crystalline or polycrystalline semiconductor doped with phosphorous. Of course, the embodiment of the present invention is not limited to the above-described materials, and various materials may be used as the second-conduction-type dopant. In addition, the second-conduction-type dopant of the second-conduction-type conductive region 30 may be identical to the second-conduction-type dopant of the base region 10 or may differ from the second-conduction-type dopant of the base region 10.

In this embodiment, the second-conduction-type conductive region 30 is illustrated as having a homogeneous structure having a uniform doping concentration throughout the second-conduction-type conductive region 30. Of course, the embodiment of the present invention is not limited to the above-described structure. In another embodiment, the second-conduction-type conductive region 30 may have a selective structure. In the selective structure, the second-conduction-type conductive region 30 may have a high doping concentration, a great junction depth, and low resistance at a portion thereof adjacent to the second electrode 44 while having a low doping concentration, a small junction depth, and high resistance at the remaining portion of the second-conduction-type conductive region 30. The selective structure of the second-conduction-type conductive region 30 is identical or similar to that of the first-conduction-type conductive region 20 illustrated in FIG. 4 and, as such, the description given of the first-conduction-type conductive region 20 with reference to FIG. 4 in association with the selective structure may be applied to the second-conduction-type conductive region 30. In another embodiment, the second-conduction-type conductive region 30 may have a local structure, as illustrated in FIG. 4.

Referring to FIG. 4, the second-conduction-type conductive region 30, which has a local structure, may include a first portion 30a locally formed at a portion of the second-conduction-type conductive region 30 connected to the second electrode 44. Accordingly, the second-conduction-type conductive region 30 exhibits reduced contact resistance to the second electrode 44 at the portion thereof connected to the second electrode 44 and, as such, may have excellent fill factor (FF) characteristics. On the other hand, no second-conduction-type conductive region 30 constituted by a doped region is formed at a region not connected to the second electrode 44 and, as such, re-coupling (or recombination) possibly occurring at the doped region may be reduced. Accordingly, short-circuit current density Jsc and open-circuit voltage may be enhanced. In addition, excellent internal quantum efficiency (IQE) may be exhibited at the region where no second-conduction-type conductive region is formed and, as such, characteristics associated with a long-wavelength light may be excellent. Accordingly, it may be possible to greatly enhance characteristics associated with a long-wavelength light, as compared to the homogenous structure and selective structure having a doped region throughout the structure. Thus, the second-conduction-type conductive region 30, which has the local structure as described above, may be excellent in terms of fill factor, short-circuit current density, and open-circuit voltage and, as such, may achieve an enhancement in efficiency of the solar cell 150.

The second-conduction-type conductive region 30 may have various structures other than the above-described structures.

Again referring to FIG. 3, the first passivation film 22 and anti-reflective film 24 are sequentially formed over the front surface of the semiconductor substrate 160, for example, on the first-conduction-type conductive region 20 formed in or on the semiconductor substrate 160. The first electrode 42 is electrically connected to (for example, contacts) the first-conduction-type conductive region 20 through the first passivation film 22 and anti-reflective film 24 (for example, through openings 102).

The first passivation film 22 and anti-reflective film 24 may be substantially formed throughout the front surface of the semiconductor substrate 160, except for the openings 102 corresponding to the first electrode 42.

The first passivation film 22 is formed to contact the first-conduction-type conductive region 20 and, as such, inactivates defects present in the surface or bulk of the first-conduction-type conductive region 20. Thus, recombination sites of minority carriers are removed and, as such, open-circuit voltage Voc of the solar cell 150 may be increased. The anti-reflective film 24 reduces reflectance of light incident upon the front surface of the semiconductor substrate 160. Thus, the amount of light reaching a pn junction formed by the base region 10 and the first-conduction-type conductive region 20 may be increased in accordance with reduced reflectance of light incident upon the front surface of the semiconductor substrate 160. Accordingly, short-circuit current Isc of the solar cell 150 may be increased. As a result, the open-circuit voltage and short-circuit current Isc of the solar cell 150 may be increased by the first passivation film 22 and anti-reflective film 24 and, as such, the efficiency of the solar cell 150 may be enhanced.

The first passivation film 22 may be made of various materials. For example, the first passivation film 22 may have a single-layer structure including one film selected from the group consisting of a silicon nitride film, a hydrogen-containing silicon nitride film, a silicon oxide film, a silicon oxynitride film, an aluminum oxide film, an $MgF_2$ film, a ZnS film, a $TiO_2$ film, and a $CeO_2$ film or may have a multilayer structure including two or more of the above-listed films in combination. For example, when the first-conduction-type conductive region 20 has n-type conductivity, the first passivation film 22 may include a silicon oxide film or silicon nitride film having fixed positive charges. On the other hand, when the first-conduction-type conductive region 20 has p-type conductivity, the first passivation film 22 may include an aluminum oxide film having fixed negative charges.

The anti-reflective film 24 may be made of various materials. For example, the anti-reflective film 24 may have a single-layer structure including one film selected from the group consisting of a silicon nitride film, a hydrogen-containing silicon nitride film, a silicon oxide film, a silicon oxynitride film, an aluminum oxide film, an $MgF_2$ film, a ZnS film, a $TiO_2$ film, and a $CeO_2$ film or may have a multilayer structure including two or more of the above-listed films in combination. For example, the anti-reflective film 24 may include a silicon oxide film.

Of course, the embodiment of the present invention is not limited to the above-described materials, and the first passivation film 22 and anti-reflective film 24 may be made of various materials. One of the first passivation film 22 and anti-reflective film 24 may perform both the anti-reflection function and the passivation function and, as such, the other of the first passivation film 22 and anti-reflective film 24 may be omitted. Various films other than the first passivation film 22 and anti-reflective film 24 may also be formed on the semiconductor substrate 160. In addition, various variations are possible.

The first electrode 42 is electrically connected to the first-conduction-type conductive region 20 via the openings 102 formed through the first passivation film 22 and anti-reflective film 24 (that is, through the first passivation film 22 and anti-reflective film 24). The first electrode 42 may be made of a material having excellent electrical conductivity (for example, metal). The first electrode 42 may have a certain pattern to allow transmission of light. A detailed structure of the first electrode 42 will be described later with reference to FIG. 9.

The second passivation film 32 is formed on the back surface of the semiconductor substrate 160, for example, on the second-conduction-type conductive region 30 formed at the semiconductor substrate 160. The second electrode 44 is electrically connected to (for example, contacts) the second-conduction-type conductive region 30 through the second passivation film 32 (for example, through openings 104).

The second passivation film 32 may be substantially formed throughout the back surface of the semiconductor substrate 160, except for the openings 104 corresponding to the second electrode 44.

The second passivation film 32 is formed to contact the second-conduction-type conductive region 30 and, as such, inactivates defects present in the surface or bulk of the second-conduction-type conductive region 30. Thus, recombination sites of minority carriers are removed and, as such, open-circuit voltage Voc of the solar cell 150 may be increased.

The second passivation film 32 may be made of various materials. For example, the second passivation film 32 may have a single-layer structure including one film selected from the group consisting of a silicon nitride film, a hydrogen-containing silicon nitride film, a silicon oxide film, a silicon oxynitride film, an aluminum oxide film, an $MgF_2$ film, a ZnS film, a $TiO_2$ film, and a $CeO_2$ film or may have a multilayer structure including two or more of the above-listed films in combination. For example, when the second-conduction-type conductive region 30 has n-type conductivity, the second passivation film 32 may include a silicon oxide film or silicon nitride film having fixed positive charges. On the other hand, when the second-conduction-type conductive region 30 has p-type conductivity, the second passivation film 32 may include an aluminum oxide film having fixed negative charges.

Of course, the embodiment of the present invention is not limited to the above-described materials, and the second passivation film 32 may be made of various materials. Various films other than the second passivation film 32 may also be formed on the back surface of the semiconductor substrate 160. In addition, various variations are possible.

The second electrode 44 is electrically connected to the second-conduction-type conductive region 30 via the openings 104 formed through the second passivation film 32. The second electrode 44 may be made of a material having excellent electrical conductivity (for example, metal). The second electrode 44 may have a certain pattern to allow transmission of light. A detailed structure of the second electrode 44 will be described later.

As described above, in this embodiment, the first and second electrodes 42 and 44 of the solar cell 150 have predetermined patterns and, as such, the solar cell 150 has a bi-facial structure in which light can be incident upon both the front and back surfaces of the semiconductor substrate 160. Accordingly, the amount of light utilized by the solar cell 150 is increased and, as such, an enhancement in efficiency of the solar cell 150 may be achieved.

Of course, the embodiment of the present invention is not limited to the above-described structure. The second electrode 44 may have a structure formed throughout the back surface of the semiconductor substrate 160. The first and second-conduction-type conductive regions 20 and 30 and the first and second electrodes 42 and 44 may also be arranged at one surface of the semiconductor substrate 160 (for example, the back surface). In addition, at least one of the first and second-conduction-type conductive regions 20 and 30 may be formed to extend over both surfaces of the semiconductor substrate 160. That is, the above-described solar cell 150 is only illustrative and, as such, the embodiment of the present invention is not limited thereto.

The above-described solar cell 150 is electrically connected to another, neighboring solar cell 150 by leads 142. This will be described in more detail with reference to FIG. 5 together with FIGS. 1 and 2.

Figure 5:
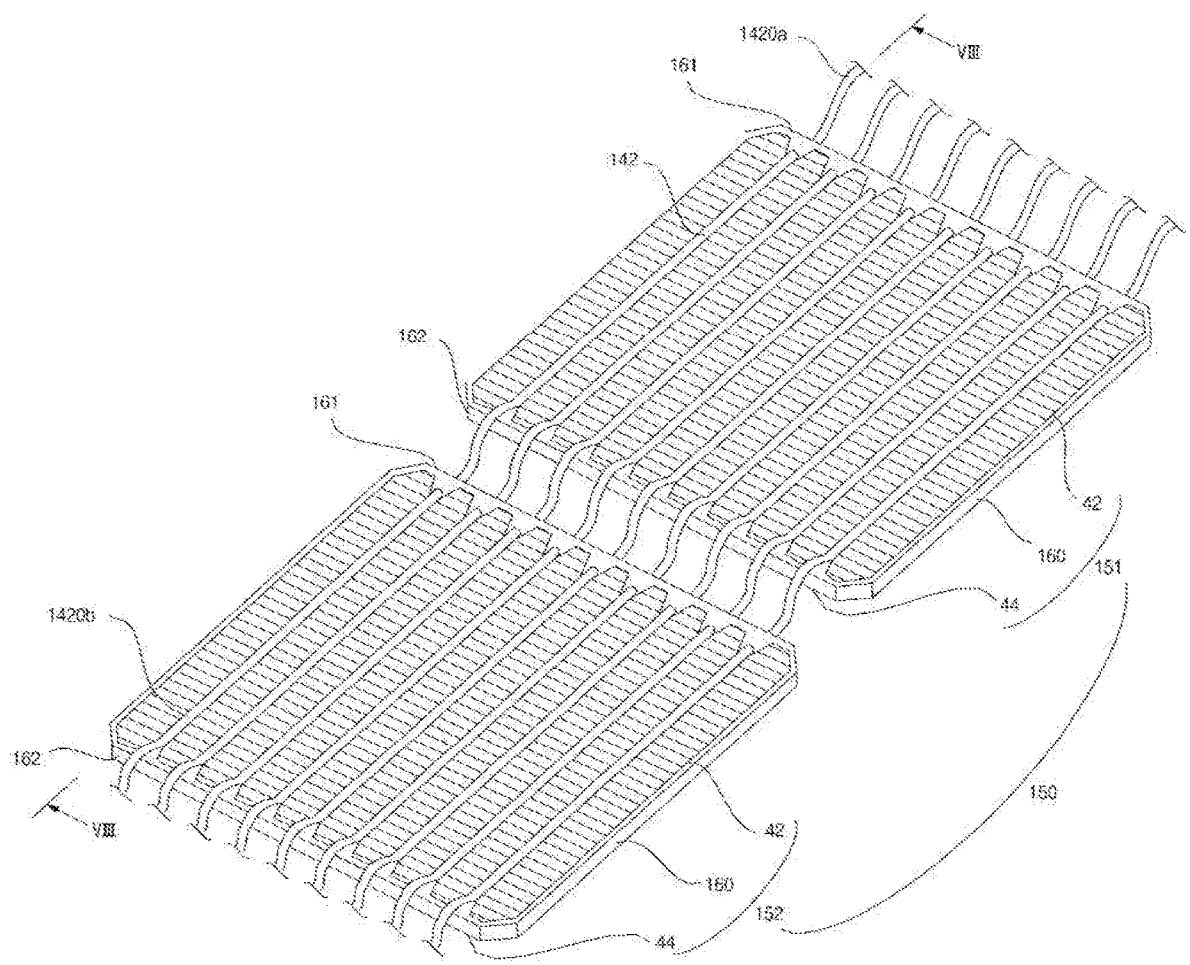
FIG. 5 is a perspective view briefly illustrating a first solar cell and a second solar cell, which are connected by leads, in the solar cell panel of FIG. 1.
Figure 6:
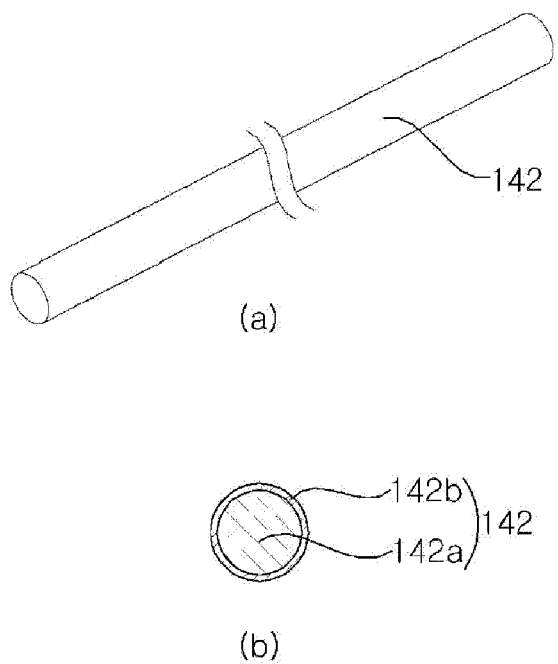
FIG. 6 illustrates one lead before attachment thereof to electrodes of one solar cell illustrated in FIG. 1, through a perspective view and a sectional view.
Figure 7:
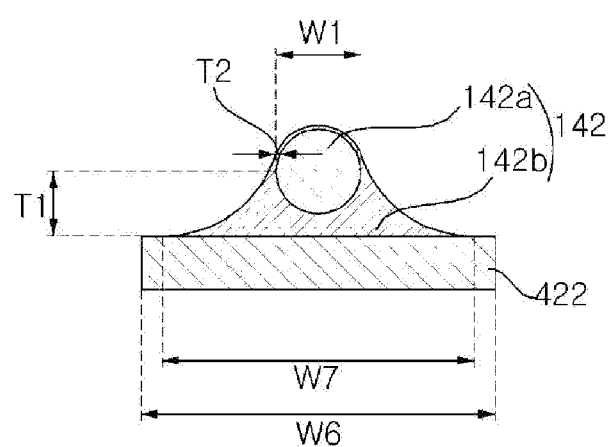
FIG. 7 is a sectional view illustrating the lead attached to pad sections of the electrode in the solar cell illustrated in FIG. 1.
Figure 8:
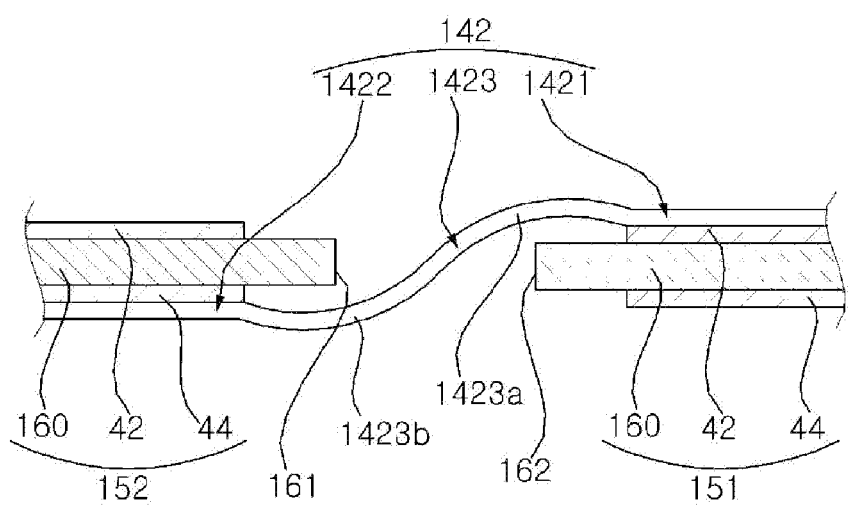
FIG. 8 is a brief sectional view along a VIII-VIII line of FIG. 5.

FIG. 5 is a perspective view briefly illustrating a first solar cell 151 and a second solar cell 152, which are connected by leads 142, in the solar cell panel 100 of FIG. 1. In FIG. 5, each solar cell 150 is briefly illustrated mainly in conjunction with the semiconductor substrate 160 and electrodes 42 and 44 thereof. FIG. 6 illustrates one lead 142 before attachment thereof to the electrodes 42 and 44 of one solar cell 150 illustrated in FIG. 1, through a perspective view and a sectional view. FIG. 7 is a sectional view illustrating the lead 142 attached to pad sections (designated by reference numeral "422" in FIG. 9) of the electrode 42 or 44 in the solar cell 150 illustrated in FIG. 1. FIG. 8 is a brief sectional view along a VIII-VIII line of FIG. 5. In FIG. 7, only the pad sections 422 and lead 142 are shown for simplicity of illustration and description. In FIG. 8, illustration is given mainly in conjunction with leads 142 connecting the first solar cell 151 and the second solar cell 152.

As illustrated in FIG. 5, two neighboring solar cells 150 of a plurality of solar cells 150 (for example, the first solar cell 151 and second solar cell 152) may be connected by leads 142. In this instance, the leads 142 connect the first electrode 42 disposed at the front surface of the first solar cell 151 and the second electrode 44 disposed at the back surface of the second solar cell 152 arranged at one side of the first solar cell 151 (a left lower side of FIG. 5). Other leads 1420a connect the second electrode 44 disposed at the back surface of the first solar cell 151 and the first electrode 42 disposed at the front surface of another solar cell to be arranged at the other side of the first solar cell 151 (a right upper side of FIG. 5). Other leads 1420b connect the first electrode 42 disposed at the front surface of the second solar cell 152 and the second electrode 44 disposed at the back surface of another solar cell to be arranged at one side of the second solar cell 152 (a left lower side of FIG. 5). Thus, a plurality of solar cells 150 may be connected by the leads 142, 1420a and 1420b, to form one solar cell string. In the following description, description given of leads 142 may be applied to all leads 142 connecting two neighboring solar cells 150.

In this embodiment, each lead 142 may include a first section 1421 connected to the first electrode 42 of the first solar cell 151 (for example, a bus bar line 42b of the first electrode 42) at the front surface of the first solar cell 151 while extending from a first edge 161 of the first solar cell 151 toward a second edge 162 of the first solar cell 151 opposite the first edge 161, a second section 1422 connected to the second electrode 44 of the second solar cell 152 (for example, a bus bar line 44b of the second electrode 44) at the back surface of the second solar cell 152 while extending from a first edge 161 of the second solar cell 152 towards a second edge 162 of the second solar cell 152 opposite the first edge 161 of the second solar cell 152, and a third section 1423 extending from the front surface of the first solar cell 151 at the second edge 162 of the first solar cell 151 to the back surface of the second solar cell at the first edge 161 of the second solar cell 152, to connect the first section 1421 and second section 1422. Accordingly, the lead 142 may be arranged to extend across the first solar cell 151 along a portion of the first solar cell 151 while extending across the second solar cell 152 along a portion of the second solar cell 152. Since the lead 142 is formed only in regions corresponding to portions of the first and second solar cells 151 and 152 (for example, the bus bar electrodes 42b) while having a smaller width than the first and second solar cells 151 and 152), the lead 142 may effectively connect the first and second solar cells 151 and 152 in spite of a small area thereof.

For example, the lead 142 may be arranged at the corresponding first and second electrodes 42 and 44 of the first and second solar cells 151 and 152, to extend lengthily along the bus bar lines 42b of the first and second electrodes and 44 while contacting the bus bar lines 42b. Accordingly, the lead 142 continuously contacts the first and second electrodes 42 and 44 and, as such, electrical connection characteristics may be enhanced. Of course, the embodiment of the present invention is not limited to the above-described arrangement. The bus bar lines 42b may be omitted. In this instance, the leads 142 may be arranged to extend in a direction crossing a plurality of finger lines 42a, to be connected to the finger lines 42a through connection therebetween while intersecting the finger lines 42a. Of course, the embodiment of the present invention is not limited to such an arrangement.

With reference to one surface of each solar cell 150, a plurality of leads 142 is provided and, as such, electrical connection characteristics of the solar cell 150 to another, neighboring solar cell 150 may be enhanced. For example, in this embodiment, each lead 142 is constituted by a wire having a smaller width than a ribbon having a relatively great width (for example, 1 to 2 mm), which has been used in conventional instances. To this end, a greater number of leads 142 (for example, two to five) than that of ribbons as described above are used with reference to one surface of each solar cell 150.

As illustrated in FIG. 6, in this embodiment, each lead 142 includes a core layer 142a, and a coating layer 142b coated over an outer surface of the core layer 142a to a small thickness. The core layer 142a is constituted by a wire having excellent electrical conductivity or the like, to substantially transfer current. The coating layer 142b may have various functions for protecting the core layer 142a or enhancing attachment characteristics of the lead 142. For example, the coating layer 142b may include a solder material and, as such, may function to easily attach the lead 142 to the electrodes 42 and 44 in accordance with melting thereof by heat. Thus, the lead 142 may be easily attached to the electrodes 42 and 44 in accordance with soldering through application of heat after the lead 142 is disposed on the electrodes 42 and 44, without using a separate adhesive. Accordingly, a tabbing process may be simplified.

In this instance, the tabbing process may be carried out by coating a flux over the lead 142, disposing the flux-coated lead 142 on the electrodes 42 and 44, and then applying heat to the flux-coated lead 142. The flux is adapted to prevent formation of an oxide film obstructing soldering. In this regard, the flux may not be necessary.

The core layer 142a may include a material exhibiting excellent electrical conductivity (for example, metal, for example, Ni, Cu, Ag, or Al) as a major material thereof (for example, a material having a content of 50 wt % or more, for example, a material having a content of 90 wt % or more). When the coating layer 142b includes a solder material, the coating layer 142b may include a material such as Pb, Sn, SnIn, SnBi, SnPb, SnPbAg, SnCuAg or SnCu as a major material thereof. Of course, the embodiment of the present invention is not limited to the above-described materials and, the core layer 142a and coating layer 142b may include various materials.

In another example, the lead 142 may be attached to the electrodes 42 and 44, using a separate conductive adhesive. In this instance, the lead 142 may or may not include the coating layer 142b. The conductive adhesive may be a material constituted by an epoxy-based synthetic resin or silicon-based synthetic resin containing conductive particles of Ni, Al, Ag, Cu, Pb, Sn, SnIn, SnBi, SnP, SnPbAg, SnCuAg, SnCu or the like. The material is maintained in a liquid phase at normal temperature, and is thermally cured by heat applied thereto. When such a conductive adhesive is used, it may be possible to attach the lead 142 to the electrodes 42 and 44 by disposing the conductive adhesive on the electrodes 42 and 44, disposing the lead 142 on the conductive adhesive, and then applying heat to the lead 142, or coating or disposing the conductive adhesive on the surface of the lead 142, disposing the lead 142 on the electrodes 42 and 44, and then applying heat to the lead 142.

When the wire, which has a smaller width than the existing ribbon, is used as the lead 142, material costs may be greatly reduced. Since the lead 142 has a smaller width than the ribbon, it may be possible to use a sufficient number of leads 142 and, as such, the movement distance of carriers may be minimized. Accordingly, the output power of the solar cell panel 100 may be enhanced.

The wire constituting the lead 142 in accordance with this embodiment may have a circular or oval cross-section, a curved cross-section, or a round cross-section, to induce reflection or diffuse reflection. Accordingly, light reflected from a round surface of the wire constituting the lead 142 may be reflected or totally reflected upon the front substrate 110 or back substrate 200 disposed at the front surface or back surface of the solar cell 150 and, as such, may be again incident upon the solar cell 150. Thus, the output power of the solar cell panel 100 may be effectively enhanced. Of course, the embodiment of the present invention is not limited to the above-described shape, and the wire constituting the lead 142 may have a quadrangular shape or a polygonal shape. The wire may also have various other shapes.

In this embodiment, the lead 142 may have a width W1 of 250 to 500 μm. By virtue of the lead 142, which has a wire structure while having the above-described width, it may be possible to effectively transfer current generated in the solar cell 150 to a circuit arranged outside the solar cell 150 (for example, a bus ribbon or a bypass diode of a junction box) or to another solar cell 150. In this embodiment, the lead 142 may be fixed to the electrodes 42 and 44 of the solar cell 150 after being independently disposed on the electrodes and 44 under the condition that the lead 142 is not inserted in to a separate layer or film or the like. Accordingly, when the width W1 of the lead 142 is less than 250 μm, the strength of the lead 142 may be insufficient. In addition, the lead 142 may exhibit inferior electrical connection characteristics and low attachment force because the connection area of the lead 142 to the electrodes 42 and 44 is too small. On the other hand, when the width W1 of the lead 142 is greater than 500 μm, the material costs of the lead 142 increase. In addition, the lead 142 may obstruct incidence of light upon the front surface of the solar cell 150 and, as such, shading loss may increase. In addition, force applied to the lead 142 in a direction away from the electrodes 42 and 44 may increase and, as such, an attachment force between the lead 142 and the electrodes 42 and 44 may be reduced. In severe instances, cracks or the like may be generated at the electrodes 42 and 44 or the semiconductor substrate 160. For example, the width W1 of the lead 142 may be 350 to 450 μm (for example, 350 to 400 μm). In this range, it may be possible to achieve an enhancement in output power while increasing the attachment force to the electrodes 42 and 44.

In this instance, the thickness of the coating layer 142b in the lead 142, for example, T2, is as small as 10% or less the width of the core layer 142a before the tabbing process (for example, equal to or less than 20 μm, for example, 7 to 20 μm). When the thickness T2 of the coating layer 142b is less than 7 μm, it may be impossible to smoothly carry out the tabbing process. On the other hand when the thickness T2 of the coating layer 142b is greater than 20 μm, material costs may increase. Furthermore, the strength of the lead 142 may be reduced due to a reduction in width of the core layer 142a. Once the lead 142 is attached to the solar cell 150 in accordance with the tabbing process, the coating layer 142b flows downwards and, as such, is thickly deposited between the lead 142 and the solar cell 150 (for example, between the lead 142 and the pad sections 422 of the electrodes 42 and 44) while being thinly deposited on a surface of the core layer 142a opposite the solar cell 150, as illustrated in FIG. 7. The portion of the coating layer 142b disposed between the lead 142 and the solar cell 150 may have a width W7 equal to or greater than the diameter of the core layer 142 of the lead 142. The coating layer 142b may have a thickness T1 of 11 to 21 μm at a portion thereof between the lead 142 and the pad sections 422 of the electrodes 42 and 44. On the other hand, the coating layer 142b may have a thickness T2 as small as 2 μm or less (for example, 0.5 to 1.5 μm) at the remaining portion thereof. In the specification, the width W1 of the lead 142 may mean a width or diameter of the core layer 142a in a plane perpendicular to a thickness direction of the solar cell 150 while passing through a center of the lead 142. In this instance, the coating layer 142b has a very small thickness at a portion thereof disposed at the center of the core layer 142a and, as such, has little influence on the width of the lead 142. In this regard, the width W1 of the lead 142 may mean a sum of widths or radiuses of the core layer 142a and coating layer 142b in the plane perpendicular to the thickness direction of the solar cell 150 while passing through the center of the core layer 142a.

As described above, an enhancement in output power may be achieved by the provision of the wire-shaped leads 142. In this embodiment, however, neighboring solar cells 150 are electrically connected using leads 142 having a smaller width than those of conventional instances and, as such, the attachment force of the leads 142 to the electrodes 42 and 44 may be insufficient because the attachment area of each lead 142 to the electrodes 42 and 44 may be small. Furthermore, when the leads 142 have a round cross-section having a circular, oval or curved shape, the attachment area of each lead 142 to the electrodes 42 and 44 may be further reduced and, as such, the attachment force of each lead 142 may be further reduced. In addition, when the leads 142 have a round cross-section having a circular, oval or curved shape, the solar cell 150 or semiconductor substrate 160 may be more easily bent because the thickness of each lead 142 may be relatively increased.

For example, in a region between the first solar cell 151 and the second solar cell 152, each lead 142 should extend from a position over the front surface of the first solar cell 151 to a position beneath the back surface of the second solar cell 152. For this reason, the lead 142 may be bent in this region. That is, as illustrated in FIG. 8, the first section 1421 of the lead 142 is disposed on the first electrode 42 of the first solar cell 151 while being maintained in an attached (for example, contact) state to the first electrode 42, and the second section 1422 of the lead 142 is disposed on the second electrode 44 of the second solar cell 152 while being maintained in an attached (for example, contact) state to the second electrode 44. In this instance, the third section 1423 of the lead 142 should be connected between the first section 1421 and the second section 1422 while preventing the first and second sections 1421 and 1422 from being bent. To this end, the third section 1423 may include a portion 1423a bent to have an arc shape convex toward the front surface of the first solar cell 151, so as to be spaced apart from the first solar cell 151 by a predetermined distance at the vicinity of the second edge 162 of the first solar cell 151, and a portion 1423b bent to have an arc shape convex toward the back surface of the second solar cell 152, and connected to the portion 1423a while having an inflection point with reference to the portion 1423a, so as to be spaced apart from the first solar cell 151 by a predetermined distance at the vicinity of the first edge 161 of the second solar cell 152.

Each of the bent portions 1423a and 1423b of the third section 1423 has a part extending from a connection point of the third section 1423 connected to a corresponding one of the first and second sections 1421 and 1422 (for example, a point corresponding to the corresponding edge of the first solar cell 151 or second solar cell 152) in a direction away from a corresponding one of the first and second solar cells 151 and 152. As a result, the lead 142 is subjected to force in a direction away from the electrodes 42 and 44 in regions corresponding to facing edges of the solar cells 150.

As the boundary between the first section 1421 and the third section 1423 or the boundary between the second section 1422 and the third section 1423 (for example, a connection point of the lead 142 connected to the electrode 42 or 44) is closer to the corresponding edge of the corresponding solar cell 150, the corresponding arc-shaped portion of the third section 1423 has a gradually reduced radius of curvature. In this instance, force applied to the lead 142 in a direction away from the solar cells 150 in regions adjacent to the facing edges of the solar cells 150 is increased and, as such, an attachment force of the lead 142 to the electrodes 42 and 44 may be reduced. For this reason, when the wire-shaped leads 142 are provided, as in this embodiment, portions of the electrodes 42 and 44 connected to the leads 142 while being arranged adjacent to the solar cells 150 (for example, pad sections 422, to which the leads 142 are attached at a wide area while having high coupling force) should be spaced apart from the corresponding edges of the solar cells 150 by a predetermined distance or more and, as such, the lead 142 may be attached to the electrodes 42 and 44 while having sufficient coupling force or attachment force.

In this embodiment, accordingly, the electrodes 42 and 44 of the solar cells 150 are designed, taking into consideration the above-described conditions. This will be described in detail with reference to FIG. 9. Hereinafter, a detailed description will be given in conjunction with the first electrode 42 with reference to FIG. 9, and the second electrode 44 is then described.

Figure 9:
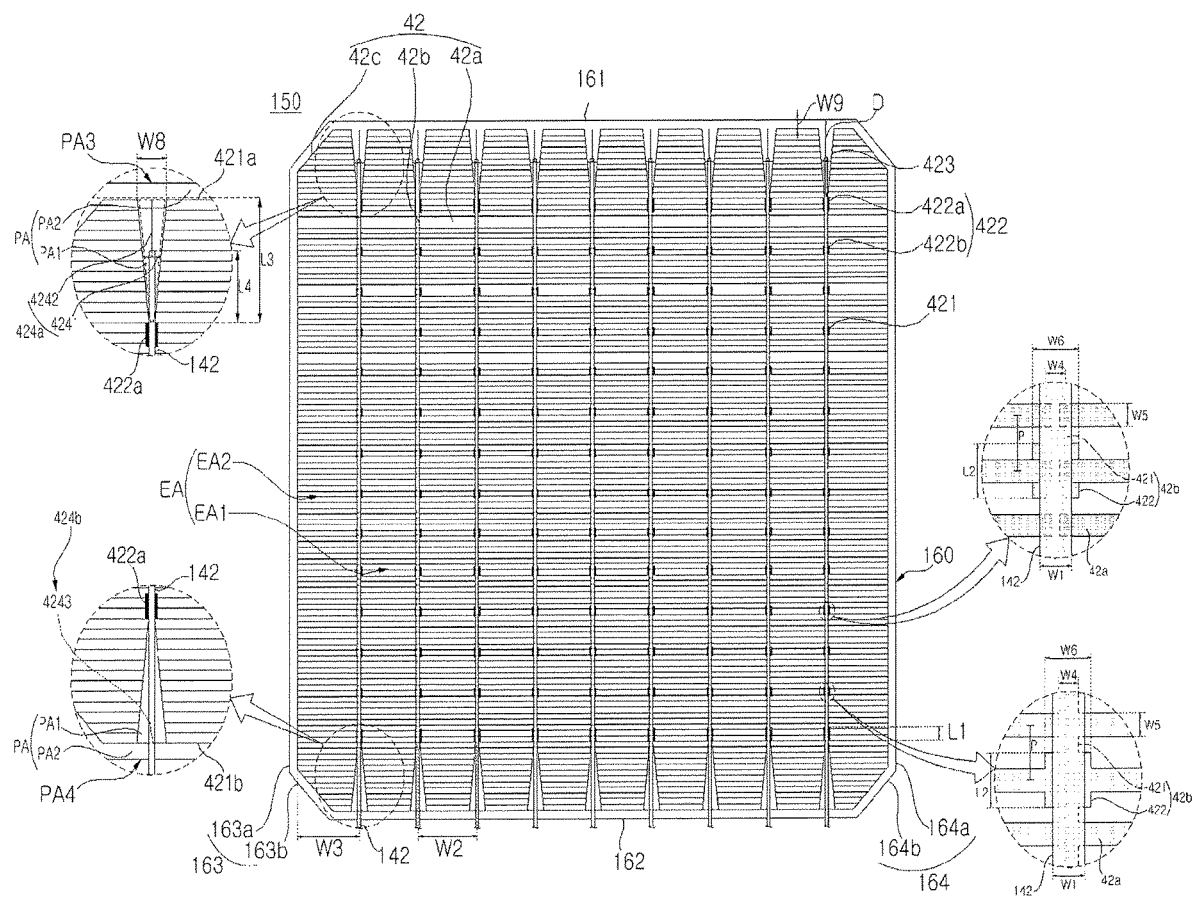
FIG. 9 is a plan view illustrating one solar cell included in the solar cell panel of FIG. 1 and ribbons connected thereto.

FIG. 9 is a plan view illustrating one solar cell included in the solar cell panel of FIG. 1 and ribbons connected thereto.

Referring to FIG. 9, in the illustrated embodiment, the solar cell 150 (or the semiconductor substrate 160) may be divided into an electrode area EA and an edge area PA. In this instance, the solar cell 150 (or the semiconductor substrate 160) may include, for example, first and second edges 161 and 162 parallel to finger lines 42a, and third and fourth edges 163 and 164 crossing (for example, perpendicularly crossing or inclinedly crossing) the finger lines 42a. The third and fourth edges 163 and 164 may include respective central portions 163a and 164a occupying large portions of the third and fourth edges 163 and 164, and respective inclined portions 163b and 164b connected to the first and second edges 161 and 162 while extending inclinedly from respective central portions 163a and 164a. Accordingly, the solar cell 150 may have, for example, an almost octagonal shape when viewed in a plane. Of course, the embodiment of the present invention is not limited to the above-described shape, and the planar shape of the solar cell 150 may be varied.

In this embodiment, the electrode area EA may be an area where the finger lines 42a, which extend in parallel, are arranged at a uniform pitch P. The electrode area EA may include a plurality of electrode areas divided by leads 142. The edge area PA may be an area defined between two adjacent ones of the electrode areas while being arranged adjacent to a corresponding one of the edges of the semiconductor substrate 160 or solar cell 150 (for example, edges extending in a longitudinal direction of the leads 142 or bus bar lines 42b or edges crossing (perpendicularly crossing) the leads 142 or bus bar lines 42b). In this instance, the edge area PA may be an area where electrode portions 424a and 424b are arranged in a lower density than that of the finger lines 42a in the electrode area EA or an area where no electrode portions 424a and 424b are arranged.

In this embodiment, the electrode area EA may include a plurality of electrode areas divided with reference to the bus bar lines 42b or leads 142. For example, the electrode area EA may include a first electrode area EA1 defined between two neighboring bus bar lines 42b or leads 142, and two second electrode areas EA2 each defined between a corresponding one of the third and fourth edges 163 and 164 in the solar cell 150 and the lead 142 arranged adjacent thereto. In this embodiment, since a plurality of leads 142 (for example, six or more) is provided with reference to one surface of the solar cell 150, a plurality of first electrode areas EA1 may be provided (the number of first electrode areas EA1 being smaller than the number of leads 142 by one).

In this instance, the width of each first electrode area EA1, for example, a width W2, may be smaller than the width of each second electrode area EA2, for example, a width W3. In this embodiment, a number of leads 142 or bus bar lines 42b are provided. Accordingly, the width W3 of each second electrode area EA2 should be relatively great in order to allow the inclined portions 163b or 164b of the third or fourth edge 163 or 164 to be disposed in the second electrode area EA2 and, as such, it may be possible to prevent the bus bar lines 42b or leads 142 from being disposed at the third or fourth edge 163 or 164. Of course, the embodiment of the present invention is not limited to the above-described conditions, and the width W2 of each first electrode area EA1 and the width W3 of each second electrode area EA2 may have various values.

Meanwhile, the edge area PA may include first edge areas PA1 each corresponding to a region where each lead 142 is disposed, while being defined between neighboring finger lines 42a, and second edge areas PA2 corresponding to a remaining portion of the edge area PA, except for the first edge areas PA1, while being defined between outermost ones of the finger lines 42a and corresponding ones of the first to fourth edges 161, 162, 163 and 164 of the semiconductor substrate 160, to provide a predetermined distance between the semiconductor substrate 160 and the first electrode 42. Each edge area PA1 may be arranged at a region portion adjacent to the corresponding edge of the solar cell 150 in the corresponding region where one lead 142 is disposed. Each first edge area PA1 is an area defined to space a corresponding pad section 422a apart from the corresponding edge of the solar cell 150, thereby enabling the corresponding lead 142 to be attached to the first electrode 42 by sufficient coupling force.

In this instance, the edge area PA may include a first end edge area PA3 and a second end edge area PA4, which are arranged at opposite ends of each bus bar line 42b between two adjacent electrode areas EA corresponding to the bus bar line 42b. The first end edge area PA3 is arranged at one end of the bus bar line 42b adjacent to the first edge 161 of the semiconductor substrate 160, whereas the second end edge area PA4 is arranged at the other end of the bus bar line 42b adjacent to the second edge 162 of the semiconductor substrate 160. For example, the first end edge area PA3 may include the corresponding first edge area PA1 arranged adjacent to the first edge 161, and a portion of the corresponding second edge area PA2 (for example, a portion arranged between the first edge area PA1 and the first edge 161 in the second edge area PA2). In addition, the second end edge area PA4 may include the corresponding first edge area PA1 arranged adjacent to the second edge 162, and a portion of the corresponding second edge area PA2 (for example, a portion arranged between the first edge area PA1 and the second edge 162 in the second edge area PA2).

In this instance, the first end edge area PA3 may be an area where an end of the corresponding lead 142 is disposed adjacent to the first edge 161 of the semiconductor substrate 160. The lead 142 may extend to another solar cell 150 or an external circuit after passing the second end edge area PA4 and the second edge 162 of the semiconductor 160. In the specification, the terms "first end", "second end", "one end", and "other end" are used to distinguish different elements from one another, and the embodiment of the present invention is not limited thereto.

The first electrode 42 may include a plurality of finger lines 42a spaced apart from one another in the electrode area EA while having a uniform width W5 and a uniform pitch P. In FIG. 9, the finger lines 42a are illustrated as being formed to be parallel in a first direction while being parallel to the main edges of the solar cell 150 (for example, the first and second edges 161 and 162). Of course, the embodiment of the present invention is not limited to the above-described arrangement. In this instance, the finger lines 42a may include outermost finger lines 421a and 421b respectively disposed most adjacent to the edges of the semiconductor substrate 160 (for example, the first and second edges 161 and 162).

For example, the finger lines 42a of the first electrode 42 may have a width W5 of 35 to 120 μm. The finger lines 42a of the first electrode 42 may also have a pitch P of 1.2 to 2.8 mm. The number of finger lines 42a arranged in a direction crossing the finger lines 42a may be 55 to 130. The above-described width W5 and pitch P may be obtained under simple process conditions. The width W5 and pitch P are defined to minimize shading loss caused by the finger lines 42a while achieving effective collection of current produced through photoelectric conversion. Each finger line 42a may have a thickness of 5 to 50 μm. Such a thickness of the finger line 42a may be easily obtained in a process of forming the finger line 42a. In addition, the finger line 42a may have desired specific resistance in the above-described thickness range. Of course, the embodiment of the present invention is not limited to the above-described conditions and, the width, pitch, thickness, etc., of the finger lines 42a may be varied in accordance with variation of process conditions, the size of the solar cell 150, the material of the finger lines 42a, or the like.

In this instance, the width W1 of the leads 142 may be smaller than the pitch P of the finger lines 42a while being greater than the width of the finger lines 42a. Of course, the embodiment of the present invention is not limited to such conditions, and various variations are possible.

In addition, the first electrode 42 may include at least bus bar lines 42b formed in a second direction crossing the finger lines 42a in the electrode area EA, to connect the finger lines 42a. In the illustrated embodiment, each bus bar line 42b may further include electrode portions 424a and 424b disposed in corresponding ones of the first edge areas PA1, respectively, while overlapping a corresponding one of the leads 142.

For example, each bus bar line 42b may be formed to extend continuously from a region adjacent to the first edge 161 to a region adjacent to the second edge 162 in the electrode area EA. As described above, each bus bar line 42b may be disposed to correspond to a region where each lead 142 is disposed to connect neighboring solar cells 150. The bus bar lines 42b may be provided to correspond to the leads 142 one to one. In this embodiment, accordingly, the bus bar lines 42b are equal in number to the leads 142 with reference to one surface of the solar cell 150. In this embodiment, each bus bar line 42b may mean an electrode portion, which is disposed adjacent to the corresponding lead 142, and is formed to extend in a direction perpendicularly or inclinedly crossing the finger lines 42a while being connected to, contacting, or overlapping with the corresponding lead 142.

Each bus bar line 42b may include, in the electrode area EA, a line section 421 extending lengthily in a direction that the corresponding lead 142 is connected to the bus bar line 42b, while having a relatively small width, and pad sections 422 having a greater width than the line section 421, to increase a connection area to the corresponding lead 142. By virtue of the narrow line section 421, it may be possible to minimize the area blocking light incident upon the solar cell 150. By virtue of the wide pad sections 422, it may be possible to enhance attachment force between the lead 142 and the bus bar line 42b while reducing contact resistance. Each pad section 422 may have a greater width than each line section 421 and, as such, is an area to which the corresponding lead 142 is substantially attached. Each lead 142 may be attached to the corresponding line section 421. Alternatively, the lead 142 may be simply laid on the line section 421 without being attached to the line section 421.

The pad sections 422 may include first pad sections 422a disposed at opposite ends of the line section 421 (for example, regions where the lead 142 is connected to the first electrode 42 or inner ends of the first and second end edge area PA3 and PA4) in the electrode area EA, and second pad sections 422b disposed in an inside region of the bus bar line 42b, except for the first pad sections 422a. As described above, force may be applied to the lead 142 at the ends of the line section 421 or at the first pad sections 422a in a direction away from the first electrode 42 (a direction away from the semiconductor substrate 160). Accordingly, when the first pad sections 422a have a greater area than the second pad sections 422b, strong attachment force may be provided between the lead 142 and the first electrode 42. In this instance, even when the first pad sections 422a have a greater width than the second pad sections 422b, there is no remarkable effect in enhancing attachment force to the lead 142. In this regard, the first pad sections 422a may have a length L1 (a length measured in a longitudinal direction of the lead 142) greater than a length L2 of the second pad sections 422b (a length measured in the longitudinal direction of the lead 142).

The pad sections 422 may have a width (for example, the widths of the first pad sections 422a and second pad sections 422b) greater than those of the line section 421, extension sections 423, electrode portions 424a and 424b, and finger lines 42a. The pitch of the bus bar lines 42b may be greater than the pitch of the finger lines 42a.

In this embodiment, the line sections 421 of the bus bar lines 42b are illustrated as corresponding to respective leads 142. In more detail, in conventional instances, bus bar electrodes, which correspond to the leads 142 and have a much greater width than the finger lines 42a, are provided. In this embodiment, however, the line sections 421 of the bus bar lines 42b, which have a much smaller width than the bus bar electrodes, are provided. In this embodiment, each line section 421 connects a plurality of finger lines 42a and, as such, provides a path, along which bypass of carriers is carried out when a part of the finger lines 42a is short-circuited.

In the specification, the bus bar electrodes mean electrode portions formed in a direction crossing the finger lines, to correspond to respective ribbons, while having a width corresponding to 12 times or more (normally 15 times or more) the width of each finger line. Since the bus bar electrodes have a relatively great width, two or three bus bar electrodes are formed at normal instances. Meanwhile, the line sections 421 of the bus bar lines 42b in this embodiment may mean electrode portions formed in a direction crossing the finger lines 42a, to correspond to respective leads 142, while having a width corresponding to 10 times or less the width of each finger line 42a.

For example, the width of the line section 421, for example, a width W4, may be 0.5 to 10 times the width of each finger line 42a, for example, a width W5. When the ratio of the width W4 to the width W5 is 0.5 or less, effects of the line section 421 may be insufficient. On the other hand, when the ratio is greater than 10, shading loss may be increased because the width W4 of the line section 421 is excessively great. For example, in this embodiment, a number of line sections 421 is provided because a number of leads 142 is provided and, as such, shading loss may be further increased. For example, the width W4 of the line section 421 may be 0.5 to 7 times the width W5 of the finger line 42a. When the width W4 of the line section 421 increases up to 7 times the width W5 of the finger line 42a, it may be possible to further reduce shading loss. For example, the width W4 of the line section 421 may be 0.5 to 4 times the width W5 of the finger line 42a, taking shading loss into consideration. For example, the width W4 of the line section 421 may be 0.5 to 2 times the width W5 of the finger line 42a. In this range, efficiency of the solar cell 150 may be greatly enhanced.

Meanwhile, the width W4 of the line section 421 may be equal to or smaller than the width W1 of the lead 142. When the lead 142 has a circular, oval or round shape, the contact width or area of the lead 142 contacting the line section 421 at a back surface thereof and, as such, the width W4 of the line section 421 may be equal to or smaller than the width W1 of the lead 142. When the width W4 of the line section 421 is relatively small, it may be possible to reduce the material costs of the first electrode 42 through reduction of the area of the first electrode 42.

For example, the ratio of the width W1 of the lead 142 to the width W4 of the line section 421 may be 1:0.07 to 1:1. When the ratio is less than 1:0.07, electrical characteristics or the like may be degraded because the width W4 of the line section 421 is too small. On the other hand, when the ratio is greater than 1:1, it may be impossible to greatly enhance contact characteristics to the line section 421 or the like in spite of an increase in area of the first electrode 42. As a result, shading loss, material costs, etc., may be increased.

For example, the ratio may be 1:0.1 to 1:0.5 (for example, 1:0.1 to 1:0.3), taking into consideration shading loss, material costs, etc.

Meanwhile, the width W4 of the line section 421 may be 35 to 350 μm. When the width W4 of the line section 421 is less than 35 μm, electrical characteristics or the like may be degraded because the width W4 of the line section 421 is too small. On the other hand, when the width W4 of the line section 421 is greater than 350 μm, it may be impossible to greatly enhance contact characteristics to the line section 421 or the like in spite of an increase in area of the first electrode 42. As a result, shading loss, material costs, etc., may be increased. For example, the width W4 of the line section 421 may be 35 to 200 μm (for example, 35 to 120 μm), taking into consideration shading loss, material costs, etc. The width W4 of the line section 421 connecting the corresponding pad sections 422 may be 75 to 120 μm, taking electrical characteristics into consideration.

Of course, the embodiment of the present invention is not limited to the above-described conditions and, the width W4 of the line section 421 may be varied within a range capable of minimizing shading loss while effectively transferring current produced through photoelectric conversion.

Meanwhile, the width of each pad section 422, for example, a width W6, is greater than the width W4 of the line section 421 while being equal to or greater than the width W1 of the lead 142. Since the pad section 422 is a section to achieve an enhancement in attachment force of the lead 142 through increase of a contact area thereof to the lead 142, the pad section 422 has a width greater than the width of the line section 421 while being equal to or greater than the width of the lead 142.

For example, the ratio of the width W1 of the lead 142 to the width W6 of the pad section 422 may be 1:1 to 1:5. When the ratio is less than 1:1, attachment force between the pad section 422 and the lead 142 may be insufficient because the width W6 of the pad section 422 is insufficient. On the other hand, when the ratio is greater than 1:5, shading loss may be increased because the area of the pad section 422 causing shading loss is increased. The ratio may be 1:2 to 1:4 (for example, 1:2.5 to 1:4), taking into consideration attachment force, shading loss, etc.

Meanwhile, for example, the width W6 of the pad section 422 may be 0.25 to 2.5 mm. When the width W6 of the pad section 422 is less than 0.25 mm, attachment force between the pad section 422 and the lead 142 may be insufficient because the contact area of the pad section 422 to the lead 142 is insufficient. On the other hand, when the width W6 of the pad section 422 is greater than 2.5 mm, shading loss may be increased because the area of the pad section 422 causing shading loss is increased. For example, the width W6 of the pad section 422 may be 0.8 to 1.5 mm.

Meanwhile, the pad section 422 may have lengths L1 and L2 of 2 to 30 mm. When the lengths L1 and L2 of the pad section 422 are less than 0.2 mm, attachment force between the pad section 422 and the lead 142 may be insufficient because the contact area of the pad section 422 to the lead 142 is insufficient. On the other hand, when the lengths L1 and L2 of the pad section 422 are greater than 30 mm, shading loss may be increased because the area of the pad section 422 causing shading loss is increased.

In this instance, the length L1 of each first pad section 422a, to which greater force is applied, may be greater than the length L2 of each second pad section 422b. For example, the length L1 of the first pad section 422a may be 0.4 to 30 mm. Taking shading loss into consideration, the length L1 of the first pad section 422a may be 0.4 to 5 mm. The length L2 of each second pad section 422b may be 0.02 to 1 mm. For example, the length L2 of the second pad section 422b may be 0.3 to 1 mm. Accordingly, attachment force obtained by the first pad section 422a, to which greater force is applied, may be further increased, and the area of the second pad section 422b may be reduced and, as such, shading loss, material costs, etc. may be reduced.

For example, each pad section 422 may have a width of 0.5 to 2.0 mm and a length of 0.2 to 5 mm. In this instance, the widths of the first pad section 422a and second pad section 422b may be equal or differs from each other (to have a width difference of 10% or less), and the length of the first pad section 422a is greater than the length of the second pad section 422b such that the area of the first pad section 422a is greater than the area of the second pad section 422b. In this instance, accordingly, the length of the first pad section 422a may be equal to or greater than the width of the first pad section 422a (for example, the length of the first pad section 422a is greater than the width of the first pad section 422a), and the width of the second pad section 422b may be equal to or greater than the length of the second pad section 422b (for example, the width of the second pad section 422b is greater than the length of the second pad section 422b). For example, the first pad section 422a has a width of 1.0 to 1.5 mm and a length of 3.5 to 4.5 mm, and the second pad section 422b has a width of 1.0 to 1.5 mm and a length of 0.3 to 0.5 mm. Within such width and length ranges, the first and second pad sections 422a and 422b may have maximal effects.

Meanwhile, for example, the ratio of the width W5 of each finger line 42a to the lengths L1 and L2 of the pad section 422 may be 1:1.1 to 1:20. Within this range, the attachment area between the pad section 422 and the lead 142 is increased and, as such, an attachment force between the pad section 422 and the lead 142 may be increased.

Meanwhile, for example, the ratio of the width W1 of the lead 142 to the lengths L1 and L2 of each pad section 422 may be 1:1 to 1:10. When the ratio is less than 1:1, attachment force between the pad section 422 and the lead 142 may be insufficient because the lengths L1 and L2 of the pad section 422 are insufficient. On the other hand, when the ratio is greater than 1:10, shading loss may be increased because the area of the pad section 422 causing shading loss is increased. The ratio may be 1:3 to 1:6, taking into consideration attachment force, shading loss, etc.

For one bus bar line 42b, 6 to 24 (for example, 12 to 22) pad sections 422 may be provided. The pad sections 422 may be arranged while being spaced apart from one another by a certain distance. For example, one pad section 422 may be arranged per 2 to 10 finger lines 42a. In accordance with this arrangement, regions where the contact area between the bus bar line 42b and the lead 142 increases are regularly provided and, as such, an attachment force between the bus bar line 42b and the lead 142 may be increased. Alternatively, the pad sections 422 may be arranged such that the distance between adjacent ones of the pad sections 422 is varied. For example, the pad sections 422 may be arranged in a higher density at end portions of the bus bar line 42b, to which greater force is applied, as compared to the remaining portion of the bus bar line (for example, the central portion of the bus bar line 42b). Of course, various variations are possible.

Again referring to FIG. 7, when a coating layer 142b (a separate coating layer for attachment of the lead 142 to the pad sections 422, for example, a soldering layer) is disposed in a region adjacent to each pad section 422, the ratio of the width W1 of the lead 142 to the width of the coating layer 142b, for example, a width W7, may be 1:1 to 1:3.33. Of course, the embodiment of the present invention is not limited to the above-described conditions, and the ratio may have various values.

Meanwhile, the width W6 of each pad section 422 may be equal to or greater than the width W7 of the coating layer 142b in the region adjacent to each pad section 422. For example, the width W7 of the coating layer 142b in the region adjacent to the pad section 422 to the width W6 of the pad section 422 may be 1:1 to 1:4.5. When the ratio is less than 1:1, bonding characteristics of the lead 142 and pad section 422 may be inferior. On the other hand, when the ratio is greater than 1:4.5, shading loss and manufacturing costs may increase because the area of the pad section 422 increases.

Of course, the embodiment of the present invention is not limited to the above-described conditions and, the width W6 and lengths L1 and L2 of each pad section 422 may have various values within a range capable of enhancing attachment force of the pad section 422 to the lead 142 through an increase in contact area of the pad section 422 to the lead 142. Alternatively, it may be possible to separately provide the pad sections 422.

Again referring to FIG. 9, the first electrode 42 may further include the extension sections 423, each of which divides the corresponding first edge area PA1 from the corresponding electrode area EA. Each extension section 423 may extend from the corresponding end of the corresponding line section 421 (or the corresponding pad section 422), and then reaches an outermost one of the corresponding finger lines 421a disposed adjacent to the corresponding first or second end edge area PA3 or PA4 after extending along corresponding ends of the finger lines 421a. The extension section 423 may connect the ends of the finger lines 42a disposed adjacent to the first or second end edge area PA3 or PA4. When the extension sections 423 are provided, each extension section 423 functions to provide a path, along which carriers may flow when a part of the finger lines 42a disposed at the corresponding first or second end edge area PA3 or PA4 is short-circuited. In addition, the electrode portions 424a and 424b disposed in each of the first and second end edge areas PA3 and PA4 may be connected to the corresponding finger lines 42a via the corresponding extension sections 423, respectively. Then, current collected by the finger lines 42a disposed in the electrode area EA adjacent to the corresponding first or second end edge area PA3 or PA4 may be transferred to the corresponding lead 142 via the corresponding electrode portion 424a or 424b. Accordingly, current generated in the electrode area EA disposed adjacent to the first or second end edge area PA3 or PA4 may be effectively transferred to the electrode portion 424a or 424b. Of course, the embodiment of the present invention is not limited to such conditions, and the electrode portion 424a or 424b in each first edge area PA1 may be directly connected to the corresponding finger lines 42a without being connected to the corresponding extension sections 423. Other variations may also be possible.

The extension sections 423 may be inclinedly disposed on the finger lines 42a and bus bar line 42b such that the width of the first edge area PA1 is gradually increased toward a corresponding one of the first and second edges 161 and 162 of the solar cell 150. For example, the first edge area PA1 may have an almost triangular shape. The two extension sections 423 defining the first edge area PA1 may form an almost "V" shape. In accordance with such shapes, facing outer ends of the finger lines 42a in two electrode areas EA adjacent to the first edge area PA1 may be arranged to be gradually spaced farther apart from each other. In addition, the first edge area PA1 may have a shape with a width gradually increasing toward the corresponding first or second edge 161 or 162 of the solar cell 150 between the two electrode areas EA. Accordingly, the end portion of each electrode area EA adjacent to the first edge area PA1 may have a smaller width than the remaining portion of the electrode area EA. For example, the first edge area PA1 may have an isosceles triangle shape, and each electrode area EA may have an almost octagonal shape.

Accordingly, each lead 142 may be stably disposed in the corresponding edge areas PA1 without being attached to the corresponding extension sections 423. In this embodiment, the end of each lead 142 not connected to another solar cell 150 may extend to the inside of the corresponding first edge area PA1 after passing the corresponding end of the line section 421 and, as such, may be disposed inside the first edge area PA1 (or the corresponding first end edge area PA3). Accordingly, it may be possible to stably fix the lead 142 to the end of the line section 421 and, as such, the lead 142 may be fixed to the first electrode 42 by sufficient attachment force. On the other hand, when the end of the lead 142 is disposed at the end of the line section 421, or does not reach the end of the line section 421, the end of the lead 142 may be unstably attached to the first pad section 422a disposed at the end of the line section 421. Meanwhile, when the end of the lead 142 extends to the corresponding second edge area PA2, unnecessary short-circuit may be generated.

For example, the length of a portion of the lead 142 disposed in each first edge area PA1 may be greater than the length of a portion of the first edge area PA1 where the portion of the lead 142 is not disposed. That is, the ratio of a length L3 of the first edge area PA1 to a length L4 of the portion of the lead 142 disposed in the first edge area PA1 may be 1:0.5 to 1:1. In this instance, the lead 142 may be stably attached to the first pad section 422a. For example, the ratio of the length L3 of the first edge area PA1 to the length L4 of the portion of the lead 142 disposed in the first edge area PA1 may be 1:0.6 to 1:0.9. Within this range, the lead 142 may be stably attached to the first pad section 422a while being prevented from extending to the corresponding second edge area PA2. Of course, the embodiment of the present invention is not limited to the above-described conditions.

Meanwhile, the other end of the lead 142 may extend to the outside of the semiconductor substrate 160 after passing the corresponding first edge area PA1 (or the corresponding second end edge area PA4). That is, the lead 142 may continuously extend from the corresponding first end edge area PA3 to the first pad section 422a disposed adjacent to the corresponding second end edge area PA4 after passing the first pad section 422a disposed adjacent to the corresponding first end edge area PA3, and may further extend to the outside of the semiconductor substrate 160 after passing the former first pad section 422a and the second end edge area PA4.

In this instance, the lead 142 is structurally coupled or attached to the corresponding pad sections 422. On the other hand, the lead 142 may be structurally coupled or attached to the corresponding line section 421 and/or the electrode portions 424a and 424b of the corresponding first and second end edge areas PA3 and PA4 or may be maintained without being structurally coupled or attached thereto. Although the lead 412 is maintained without being structurally coupled or attached to the corresponding line section 421 and/or the electrode portions 424a and 424b of the corresponding first and second end edge areas PA3 and PA4, the lead 142 may be connected (for example, electrically connected) thereto in accordance with overlap and contact therebetween. This is because the coating layer 142b of the lead 142, which includes a solder material, may be hardly attached to the line section 421 and/or the electrode portions 424a and 424b.

For this reason, the coupling force between the bus bar line 42b and the lead 142 in the first and second end edge areas PA3 and PA4 may be smaller than the coupling force between the bus bar line 42b and the lead 142 in an area except for the first and second end edge areas PA3 and PA4. For example, the coupling force between the electrode portions 424a and 424b of the bus bar line 42b and the lead 142 in the first and second end edge areas PA3 and PA4 may be smaller than the coupling force between each pad section 422 (for example, each first pad section 422a) and the lead 142. Accordingly, sufficient coupling force may be obtained by the pad sections. In addition, reliable electrical connection may be achieved in the first and second end edge areas PA3 and PA4, even though a small electrode area is provided.

The width of each first edge area PA1 disposed between the corresponding outermost finger lines 421a and 421b (or the width of the first or second end edge area PA3 or PA4), for example, a width W8, may be greater than the width W1 of the lead 142. Accordingly, the lead 142 may be stably disposed in the first edge area PA1. For example, the lead 142 may be maintained in the first edge area PA1 even when the lead 142 is laterally bent within the first edge area PA1 during a process of attaching the lead 142.

The width W8 of the first edge area PA1 may be 0.73 to 3.8 mm. For example, the width W8 of the first edge area PA1 may be 0.73 to 2 mm. Meanwhile, the ratio of the width W1 of the lead 142 to the width of the first edge area PA1 may be 1:1.46 to 1:15.2 (for example, 1:1.46 to 1:5). Within this range, the lead 142 may be stably disposed in the first edge area PAL Meanwhile, assuming that "L" represents the width W8 of the first edge area PA1, and "D" represents an edge distance, "L" and "D" may satisfy the following Expression 1. Here, the edge distance D means the distance between an inner end of the first edge area PA1 disposed inwards of the corresponding outermost finger lines 421a or 421b (or the pad section 422 disposed at the inner end) and the edge of the solar cell 150 adjacent to the end of the first electrode 42 (for example, the first or second edge 161 or 162) in a region where the lead 142 is disposed.

$$0.9*(0.1569*D+0.3582) \leq L \leq 1.1*(0.1569*D+0.3582) \quad \text{<Expression 1>}$$

(Here, the unit of "L" is mm, and the unit of "D" is mm.)

The above Expression 1 is based on the fact that the width W8 of the first edge area PA1 should be sufficiently great when the edge distance D is great, because a phenomenon in which the lead 142 is bent may increase when the edge distance D increases. Of course, the embodiment of the present invention is not limited to the above-described conditions.

The width of each extension section 423 is smaller than the width of the line section 421. For example, the width of the line section 421 may have a value corresponding to 2 times or more the width of each extension section 423. Then, the sum of the widths of two extension sections 423 in a region where the two extension sections 423 are branched from the line section 421 is equal to or smaller than the width of the line section 421. Accordingly, it may be possible to minimize the width of each extension section 423 while preventing the width of the bus bar line 42b from being increased in a region where the two extension sections 423 are connected to the line section 421. For example, the width W4 of the line section 421 may be 2 to 10 times the width of each extension sections 423. Meanwhile, for example, the line width of each extension section 423 may be 35 to 120 μm.

Meanwhile, the width of each extension section 423 may be smaller than the width of each finger line 42a or may be equal or similar thereto. For example, the width of each extension section 423 may be 2 times or less (for example, 0.5 to 2 times) the width of each finger line 42a. In this instance, it may be possible to avoid an increase in shading loss caused by the extension sections 423 while achieving effects of the extension sections 423. Of course, the embodiment of the present invention is not limited to the above-described conditions and, each extension section 423 may have various widths in a range capable of connecting the corresponding finger lines 42a, thereby achieving flow of current.

Meanwhile, in this embodiment, each bus bar line 42b may include the electrode portions 424a and 424b respectively disposed at the corresponding first and second end edge areas PA3 and PA4. Each lead 142 overlaps with or contacts the electrode portions 424a and 424b respectively disposed at the corresponding first and second end edge areas PA3 and PA4 or may be electrically connected thereto. Accordingly, the electrode portions 424a and 424b function as a path, along which current flows to the lead 142. In this regard, it may be understood that the electrode portions 424a and 424b constitute a part of the bus bar line 424b.

In this embodiment, current generated at the electrode areas EA disposed adjacent to the first and second end edge areas PA3 and PA4 may be transferred to the corresponding lead 142 via the electrode portions 424a and 424b disposed at the first and second end edge areas PA3 and PA4. Accordingly, it may be possible to effectively transfer current generated at portions of the electrode areas EA respectively disposed adjacent to the first and second end edge areas PA3 and PA4 (for example, a portion of the electrode area EA disposed between two first edge areas PA3 disposed in parallel while extending in parallel with the finger lines 42a and/or a portion of the electrode area EA disposed between two second edge areas PA4 disposed in parallel while extending in parallel with the finger lines 42a) to the corresponding lead 142 by the corresponding electrode portions 424a and 424b. Accordingly, even when the first edge areas PA1 (or the first and second end edge areas PA3 and PA4) are provided to achieve an enhancement in the bonding force or coupling force of the leads 142, it may be possible to avoid an efficiency reduction that may be caused by the provision of the first edge areas PA1. Thus, the efficiency of the solar cell 150 may be enhanced and, as such, the output power of the solar cell panel 100 may be enhanced.

When the electrode portions 424a and 424b are not provided at the first and second end edge areas PA3 and PA4, differently than this embodiment, current generated at portions of the electrode area EA respectively disposed adjacent to the first and second end edge areas PA3 and PA4 is transferred to the corresponding lead 142 after being collected at the corresponding first pad sections 422a. In this instance, however, it may be difficult to effectively collect current generated at the portions of the electrode area EA respectively disposed adjacent to the first and second end edge areas PA3 and PA4.

To this end, in this embodiment, the electrode portions 424a and 424b are provided. The electrode portions 424a and 424b may achieve desired effects, so long as the electrode portions 424a and 424b have shapes connectable to the corresponding finger lines 42a, bus bar line 42b or lead 142. In this instance, the electrode portions 424a and 424b are arranged at the first and second end edge areas PA3 and PA4 in a lower density than that of the finger lines 42a in the electrode area EA.

For example, the first and second end edge areas PA3 and PA4 may be formed to be symmetrical with reference to a central line of the semiconductor substrate 160 (for example, a central line parallel to the finger lines 42a). Thus, in this embodiment, the first end edge areas PA3 and the second end edge areas PA4 are provided at opposite edges of the semiconductor substrate 160 (for example, the first and second edges 161 and 162), respectively, and, as such, it may be possible to effectively prevent a reduction in attachment force of the leads 142 that may occur at the opposite edges of the semiconductor substrate 160.

In this embodiment, the electrode portion 424a disposed at each first end edge area PA3 may include an opening formed through the electrode portion 424a. In this instance, the outermost end of the electrode portion 424a may extend to be flush with the outermost finger lines 421a disposed adjacent thereto or may extend outwards beyond the outermost finger lines 421a (to be closer to the first edge 161 of the semiconductor substrate 160). Similarly, the electrode portion 424b disposed at each second end edge area PA4 may include an opening formed through the electrode portion 424b. In this instance, the outermost end of the electrode portion 424b may extend to be flush with the outermost finger lines 421b disposed adjacent thereto or may extend outwards beyond the outermost finger lines 421b (to be closer to the second edge 162 of the semiconductor substrate 160). Accordingly, the electrode portions 424a and 424b may be stably connected to the corresponding lead 142. Thus, it may be possible to more stably transfer current generated at portions of the electrode area EA respectively disposed adjacent to the first and second end edge areas PA3 and PA4 to the lead 142.

Since each of the electrode portions 424a and 424b disposed at the first and second end edge areas PA3 and PA4 has an opening (a portion where no electrode is formed), as described above, it may be possible to achieve reliable connection between the electrode portions 424a and 424b and the corresponding finger lines 42a, even though the electrode portions 424a and 424b are formed in a lower density than that of electrode portions disposed in the electrode area EA. In addition, the outermost ends of the electrode portions 424a and 424b (for example, outermost ends of second electrode parts 4242 and 4243) may be disposed to be flush with the outermost finger lines 421a and 421b disposed adjacent thereto, respectively, or may be disposed outwards of the outermost finger lines 421a and 421b, respectively, and, as such, current collected at the side of outer finger lines 42a disposed adjacent to the first or second end edge area PA3 or PA4 may be effectively transferred to the corresponding lead without remaining at the outer finger lines 42a.

Meanwhile, in this embodiment, the electrode portion 424a disposed at each first end edge area PA3 and the electrode portion 424b disposed at each second end edge area PA4 have different shapes (for example, asymmetrical shapes). In this instance, accordingly, the opening of the electrode portion 424a disposed at each first end edge area PA3 and the opening of the electrode portion 424b disposed at each second end edge area PA4 may have different shapes or different arrangements. As described above, one end of each lead 142 is disposed at the corresponding first end edge area PA3, and the other end of the lead 142 extends to the outside of the semiconductor substrate 160 beyond the corresponding second end edge area PA4. Accordingly, the length of the portion of the lead 142 disposed at the first end edge area PA3 differs from the length of the portion of the lead 142 disposed at the second end edge area PA4. For example, the length of the portion of the lead 142 disposed at the second end edge area PA4 is greater than the length of the portion of the lead 142 disposed at the first end edge area PA3. Taking this condition into consideration, the electrode portion 424a disposed at the first end edge area PA3 and the electrode portion 424b disposed at the second end edge area PA4 are configured to have different shapes.

For example, the electrode portion 424a disposed at the first end edge area PA3 may include a first electrode part 4241 disposed inwards of the outermost finger lines 421a disposed adjacent to the first end edge area PA3, and a second electrode part 4242 extending from the first electrode part 4241 to a position flush with the outermost finger lines 421a or a position outwards of the outermost finger lines 421a in a direction crossing the first electrode part 4241.

In this instance, the first electrode part 4241 may be connected (for example, directly connected or connected via the corresponding extension sections 423) to the finger lines 42a disposed within portions of the electrode areas EA respectively arranged at opposite sides of the first end edge area PA3 while extending in parallel with the finger lines 42a of the electrode areas EA or crossing (for example, perpendicularly crossing) the line section 421 of the corresponding bus bar line 42b. In this instance, since the first electrode part 4241 is connected to the finger lines 42a disposed within the portions of the electrode areas EA respectively arranged at opposite sides of the first end edge area PA3, current generated at the portions of the electrode areas EA may be transferred to the first electrode part 4241. In this instance, the opening of the electrode portion 424a is defined by the first electrode part 4241, the first pad section 422a disposed at the inner end of the corresponding first edge area PA1, and the extension sections 423 disposed at the first edge area PA1.

Meanwhile, the second electrode part 4242 may cross (for example, perpendicularly cross) the finger lines 42a or may be parallel to the line section 421 of the corresponding bus bar line 42b. The second electrode part 4242 extends from the first electrode part 4241, which is spaced apart from the corresponding first pad 422a of the bus bar line 42b, and, as such, it may be possible to prevent the second electrode part 4242 from unnecessarily interfering with the first pad 422a to have increased coupling force to the corresponding lead 142. In addition, it may be possible to achieve a reduction in electrode area and, as such, material costs may be reduced. The second electrode part 4242 is disposed to pass through the center of the first electrode part 4241 and, as such, the connection area or connection reliability of the first electrode part 4241 to the lead 142 may be greatly increased. Accordingly, current transferred via the first electrode part 4241 may be stably transferred to the lead 142.

In accordance with the above-described arrangement, a kind of an opening is formed among one side of the first electrode part 4241 (a left side in the drawings), a portion of the second electrode part 4242 disposed adjacent to one side of the first electrode part 4241, and the first edge 161. Similarly, a kind of an opening is formed among the other side of the first electrode part 4241, a portion of the second electrode part 4242 disposed adjacent to the other side of the first electrode part 4241, and the first edge 161.

In this instance, for example, the first electrode part 4241 in each first edge area PA1 may be positioned to be closer to the corresponding outermost finger lines 421a or 421b than the inner end of the first edge area PA1 in a direction parallel to the corresponding line section 421. That is, the ratio of the length L3 of the first edge area PA1 to the distance between the first electrode part 4241 and the first pad 422a corresponding thereto may be 1:0.5 to 1:1. For example, the ratio of the length L3 of the first edge area PA1 to the distance between the first electrode part 4241 and the first pad 422a may be 1:0.6 to 1:0.9. In this instance, when the lead 142 extends to a position on the second electrode part 4242 while crossing the first electrode part 4241, the lead 142 may be stably attached to the first pad 422a while passing the first pad 422a. In addition, it may be possible to prevent the lead 142 from extending to the corresponding second edge area PA2. Of course, the embodiment of the present invention is not limited to the above-described conditions.

The electrode portion 424b in each second end edge area PA4 may include a third electrode part 4243 disposed at a position flush with the corresponding outermost finger lines 421b or a position outwards of the outermost finger lines 421b. In this instance, the corresponding lead 142 may extend to the outside of the semiconductor substrate 160 while crossing the third electrode part 4243. In this instance, the third electrode part 4243 may be formed to be parallel to the finger lines 42a or to cross (for example, perpendicularly cross) the line section 421 of the corresponding bus bar line 42b, and may be connected (for example, directly connected or connected via the corresponding extension sections 423) to the finger lines 42a disposed within portions of the electrode areas EA respectively arranged at opposite sides of the second end edge area PA4.

In this instance, since the third electrode part 4243 is connected to the finger lines 42a disposed within the portions of the electrode areas EA respectively arranged at opposite sides of the second end edge area PA4, current generated at the portions of the electrode areas EA may be transferred to the first electrode part 4241 via the third electrode part 4243. In the second edge area PA4, the lead 142 extends to the outside of the semiconductor substrate 160. Accordingly, although the electrode portion 424b only includes the third electrode part 4243, the lead 142 may be stably connected to the corresponding finger lines 42a. Thus, it may be possible to simplify the structure of the electrode portion 424b in the second end edge area PA4 and, as such, reduction in manufacturing costs and simplification of the manufacturing process may be achieved. In accordance with the above-described configuration, an opening is formed among the third electrode part 4243, the first pad section 422a disposed at the inner end of the first edge area PA1, and the extension sections 423 disposed at the first edge area PA1. In this instance, the distance between the third electrode part 4243 and the first pad section 422a disposed adjacent thereto is greater than the distance between the first electrode part 4241 and the first pad section 422a disposed adjacent thereto. Accordingly, the opening formed between the third electrode part 4243 and the first pad section 422a corresponding thereto while being disposed at the second end edge area PA4 may have a greater area than the opening formed between the first electrode part 4241 and the first pad section 422a corresponding thereto while being disposed at the first end edge area PA3.

Figure 13:
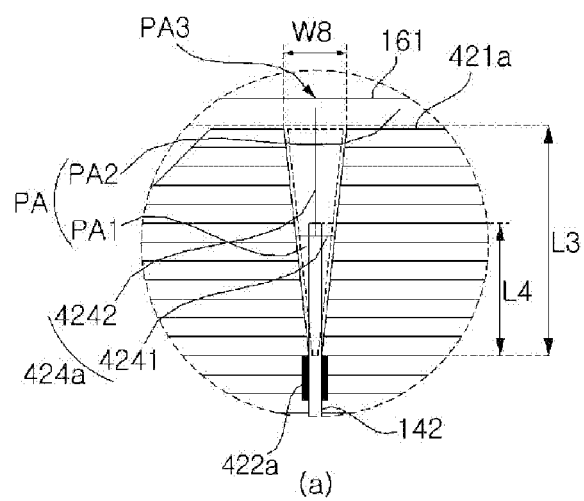
FIG. 13 is a plan view illustrating a portion of the front surface of a solar cell according to another embodiment of the present invention.
Figure 13:
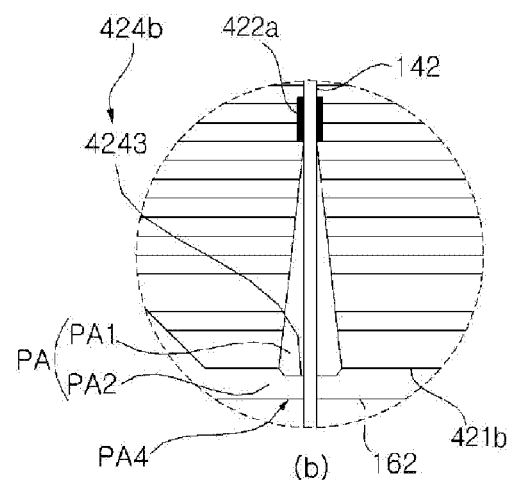
Figure 14:
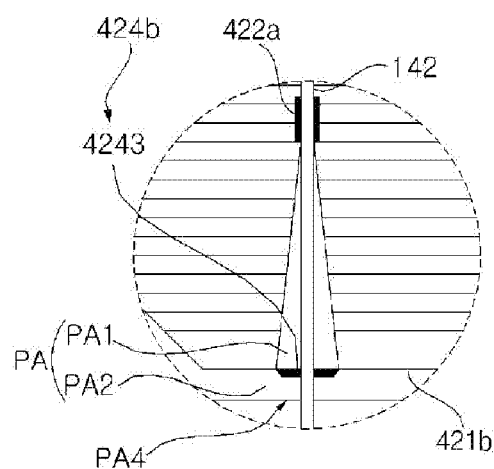
FIG. 14 is a plan view illustrating a portion of the front surface of a solar cell according to another embodiment of the present invention.
Figure 15:
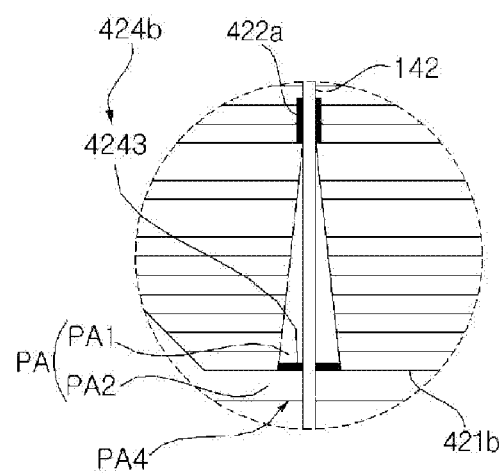
FIG. 15 is a plan view illustrating a portion of the front surface of a solar cell according to another embodiment of the present invention.

In the drawings, the electrode portions 424a and 424b are illustrated as being disposed at positions flush with the corresponding outermost finger lines 421a and 421b or extending to the positions, respectively. Of course, the embodiment of the present invention is not limited to the above-described conditions, and the electrode portions 424a and 424b may extend to protrude beyond the outermost finger lines 421a and 421b, respectively, as illustrated in FIGS. 13 to 15. This will be described later in more detail.

As described above, in this embodiment, in each first end edge area PA3, the second electrode part 4242, which extends in a direction parallel to the corresponding line section 421, is disposed at a position flush with the corresponding outermost finger lines 421a or a position outwards of the outermost finger lines 421a. On the other hand, in each second end edge area PA4, the third electrode part 4243, which extends in a direction crossing the corresponding line section 421, is disposed at a position flush with the corresponding outermost finger lines 421b or a position outwards of the outermost finger lines 421b. Such an arrangements are implemented, taking into consideration the conditions that one end of the lead 142 is disposed within the first end edge area PA3, and the lead 142 extends to the outside of the semiconductor substrate 160 while crossing the second end edge area PA4. In accordance with the above-described arrangements, it may be possible to stably connect the lead 142 to the electrode portions 424a and 424b, even when the arrangement of the lead 142 is varied.

The width of the electrode portions 424a and 424b disposed within respective edge areas PA may be greater than the width of the finger lines 42a or may be equal to or similar to the width of the finger lines 42a. The width of the electrode portions 424a and 424b may also be smaller than the pitch of the finger lines 42a. For example, the width of the electrode portions 424a and 424b may be 2 times or less (for example, 0.5 to 2 times) the width of the finger lines 42a. Alternatively, the width of the leads 142 may be greater than the widths of the electrode portions 424a and 424b. In addition, ratios of the width of the finger lines 42a to widths of other electrode portions and the width, pitch, etc., of the leads 142 may be applied to ratios of the width of the electrode portions 424a and 424b to the widths of the other electrode portions and the width, pitch, etc., of the leads 142 in the same manner. Accordingly, it may be possible to avoid problems caused by the electrode portions 424a and 424b such as an increase in shading loss while achieving effects by the provision of the electrode portions 424a and 424b. Of course, the embodiment of the present invention is not limited to the above-described conditions, and the electrode portions 424a and 424b may be satisfied, so long as the electrode portions 424a and 424b have a width range capable of achieving smooth flow of current.

In this embodiment, each bus bar line 42b may have a thickness of 3 to 45 μm. Within this thickness range, the bus bar line 42b may be easily formed, and may have a desired specific resistance. Of course, the embodiment of the present invention is not limited to the above-described conditions and, the thickness of the bus bar line 42b or the like may be varied in accordance with variations of process conditions, size of the solar cell 150, the material of the bus bar line 42b, etc.

In this embodiment, the finger lines 42a and the bus bar lines 42b may be formed as different layers, respectively. That is, the finger lines 42a may be constituted by a layer different from that of the line sections 421, pad sections 422, and electrode portions 424a and 424b constituting the bus bar lines 42b. The extension sections 423 may constitute portions of the corresponding finger line 42a and, as such, may be formed as the same layer as the finger line 42a. Alternatively, the extension sections 423 may constitute portions of the corresponding bus bar line 42b and, as such, may be formed as the same layer as the bus bar line 42b. For example, as illustrated in an enlarged upper circle of FIG. 9, the bus bar lines 42b are first formed, and the finger lines 42a are then formed to be disposed over the bus bar lines 42b such that the finger lines 42a corresponding to each bus bar lines 42b overlap at least a portion of the corresponding bus bar line 42b. In this embodiment, the finger lines 42a disposed at one side (for example, a left side of FIG. 9) of each bus bar line 42b and the finger lines 42a disposed at the other side (for example, a right side of FIG. 9) of the bus bar line 42b are spaced apart from each other. On the bus bar line 42b, accordingly, there is a region where no finger line 42a is formed and, as such, manufacturing costs may be minimized in association with formation of the finger lines 42a. Of course, the embodiment of the present invention is not limited to the above-described conditions and, the finger lines 42a may be disposed to cross the entire portion of the bus bar line 42b.

The finger lines 42a and the bus bar lines 42b may be made of the same material or different materials. For example, when the finger lines 42a and bus bar lines 42b are formed by printing, a paste for forming the bus bar lines may have relatively low viscosity, whereas a paste for forming the finger lines 42a may have relatively high viscosity. In this instance, accordingly, after curing, the bus bar lines have a greater thickness than the finger lines 42a. In this regard, when the finger lines 42a are formed after formation of the bus bar lines 42b, as described above, more stable formation thereof may be achieved.

For example, the paste for forming the finger lines 42a may have a greater content of metal (for example, silver) than the paste for forming the bus bar lines 42b. In this instance, the resistance of the finger lines 42a directly associated with collection of carriers may be reduced and, as such, an enhancement in carrier collection efficiency may be achieved. In addition, a reduction in manufacturing costs may be achieved in accordance with a reduction in metal content of the bus bar lines 42b.

Meanwhile, the finger lines 42a of the first electrode 42 may be formed to extend through the passivation film 22 and anti-reflective film 24, and the bus bar lines 42b may be formed on the passivation film 22 and anti-reflective film 24. In this instance, openings (designated by reference numeral "102" in FIG. 3) having a shape corresponding to the finger lines 42 may be formed in regions where no bus bar line 42b is formed. That is, the openings are not formed in regions where the bus bar lines 42b are formed. In this instance, the first-conduction-type conductive region 20 may have a shape corresponding to regions where the openings 102 are formed. That is, in the electrode area EA, the first-conduction-type conductive region 20 may be formed to have a shape corresponding to the finger lines 42a, without being formed in regions corresponding to the bus bar lines 42b. In this instance, the line section 421, pad sections 422 and electrode portions 424a and 424b constituting each bus bar line 42b (the extension sections 423 being also included when the extension sections 423 constitute portions of the bus bar line 42b) are formed on the passivation film 22 and anti-reflective film 24, and the first-conduction-type conductive region 20 may not be formed in regions corresponding to the sections 421, 422, 424a and 424b of each bus bar line 42b. Then, the line section 421 and pad sections 422 of each bus bar line 42b (the extension sections 423 being also included when the extension sections 423 constitute portions of the bus bar line 42b) may constitute a floating electrode.

Of course, the embodiment of the present invention is not limited to the above-described conditions and, the bus bar lines 42b may be formed after formation of the finger lines 42a. Alternatively, the finger lines 42a and the bar lines 42b may be simultaneously formed through a single process, using the same material, and, as such, may take the form of a single layer, as illustrated in an enlarged lower circle of FIG. 9. Other variations are possible.

Meanwhile, the first electrode 42 may further include edge lines 42c each connected to an end of a corresponding one of the outermost finger lines 421a and 421b disposed adjacent to a corresponding one of the third and fourth edges 163 and 164 while dividing a corresponding one of the second edge areas PA2 from the electrode area EA. Each edge line 42c may be spaced apart from the corresponding third or fourth edge 163 or 164 by a uniform distance in a region adjacent to the corresponding third or fourth edge 163 or 164 while having a shape identical or similar to that of the corresponding third or fourth edge 163 or 164. In this instance, each edge line 42c connects the ends of the finger lines 42a adjacent to the corresponding third or fourth edge 163 or 164.

The second edge areas PA2 may be arranged between the edge lines 42c and the third and fourth edges 163 and 164 and between the first and second edges 161 and 162 and the outermost finger lines 421a and 421b adjacent to the first and second edges 161 and 162, respectively, to take the form of a frame. Each second edge area PA2 may have a width W9 of 0.5 to 1.5 mm. When the width W9 of the second edge area PA2 is less than 0.5 mm, unnecessary shunting may occur. On the other hand, when the width W9 of the second edge area PA2 is greater than 1.5 mm, the area of an ineffective region may increase and, as such, efficiency of the solar cell 150 may be insufficient. Of course, the embodiment of the present invention is not limited to the above-described conditions.

The width of each edge line 42c may be equal or similar to the width of each finger line 42a. The width and thickness of each finger line 42a and relations of each finger line 42a with other electrode sections and the lead 142 may be applied to the edge lines 42c in the same manner. For example, the edge line 42c may constitute portions of the corresponding finger lines 42a.

In this embodiment, when "W" represents the width W1 of the lead 142, and "D" represents the edge distance, "W" and "D" may satisfy the following Expression 2.

$$13.732*ln(W)-71.436-0.0000321462*(W)2 \leq D \leq 13.732*ln(W)-71.436+0.0000321462*(W)2$$ <Expression 2>

(Here, the unit of "W" is μm, and the unit of "D" is mm.)

Figure 10:
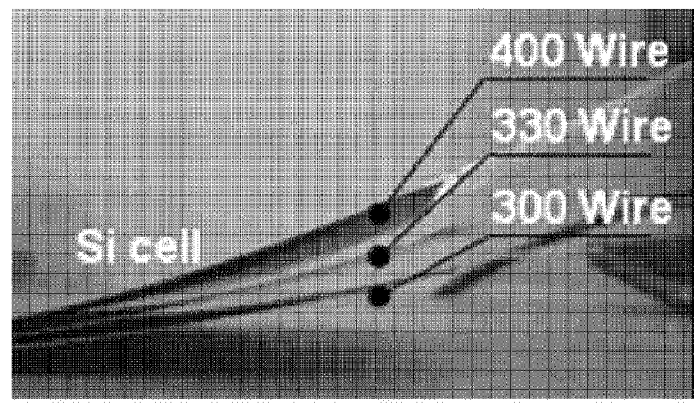
FIG. 10 is a photograph of cross-sections of solar cells, to which leads having different widths are attached, respectively.

As described above, force is applied, in a direction away from the solar cell 150, to the lead 142 at the first pad section 422a of the first electrode 42 where the lead 142 is disposed and, as such, an attachment force between the lead 142 and the first electrode 42 may be reduced. That is, as illustrated in FIG. 10, when the width W1 of the lead 142 increases, the bending degree of the solar cell 150 or semiconductor substrate 160 is increased. For reference, in FIG. 10, "300 Wire" corresponds to the instance in which the width W1 of the lead 142 is 300 μm, "330 Wire" corresponds to the instance in which the width W1 of the lead 142 is 330 μm, and "400 Wire" corresponds to the instance in which the width W1 of the lead 142 is 400 μm. When the width W1 of the lead 142 increases, greater force is applied to the lead 142 at the first pad section 422a of the first electrode 42 in a direction away from the solar cell 150 and, as such, an attachment force between the lead 142 and the first electrode 42 may be reduced. In order to prevent such attachment force reduction, the edge distance D is sufficiently secured in this embodiment, to minimize stress applied to the first electrode 42.

That is, the inventors found that, when the width W1 of the lead 142 increases, it may be possible to provide sufficient attachment force between the lead 142 and the first electrode 42 by increasing the edge distance D, and then proposed the range of the edge distance D according to the width W1 of the lead 142 as expressed in Expression 2. In this connection, the lead 142 is connected to the first pad section 422a at a sufficient area while having sufficient coupling force, as described above, and, as such, the distance between the first pad section 422a and the corresponding edge of the semiconductor substrate 160 is defined as the edge distance D.

Figure 11:
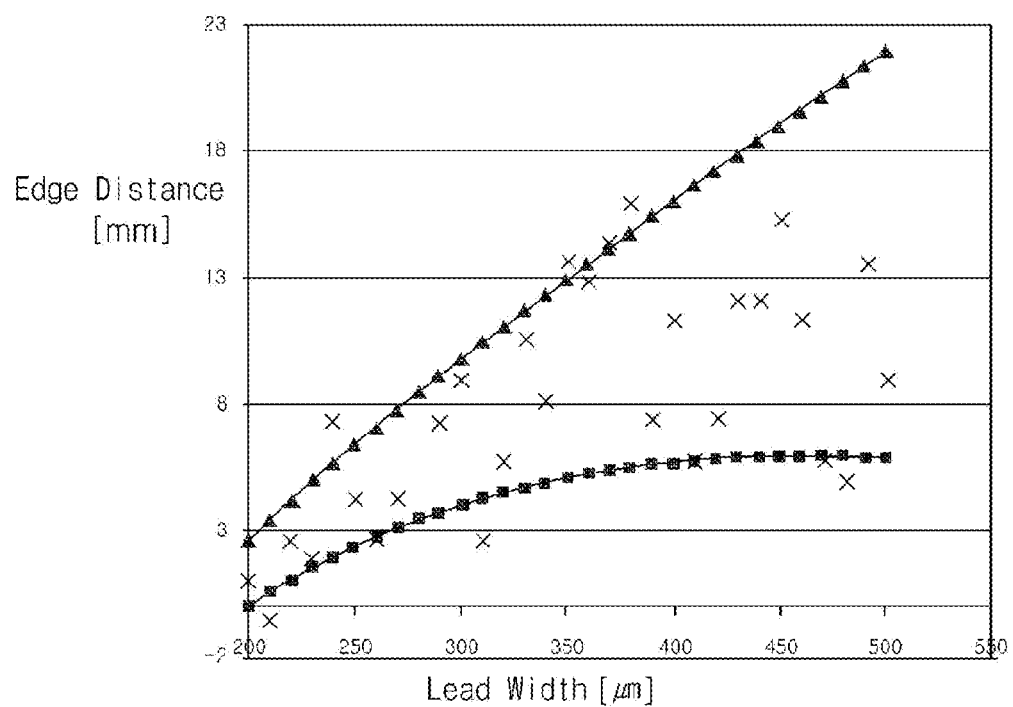
FIG. 11 is a graph depicting measured results of attachment force of the lead to an end of the electrode while varying the width of the lead and an edge distance.

For example, the inventors measured the attachment force of the lead 1422 at the first pad section 422a of the first electrode 42 while varying the width W1 of the lead 142 and the edge distance D. During measurement, instances in which attachment force having a predetermined value or more (for example, 1.5N or more, more preferably, 2N or more) is exhibited were sought, and instances having the predetermined value or more were marked in FIG. 11, using a mark "x". Thereafter, a range of the edge distance D according to the width W1 of the lead 142 where marks "x" are located was sought and, as such, the above Expression 2 as to lower and upper limits of the edge distance D was derived.

When the edge distance D is within the range expressed by the above Expression 2 under the condition that the width W1 of the lead 142 has a constant value, the lead 142, which has a wire shape, may be maintained in a state of being stably attached to the ends of the first electrode 42. In this embodiment, accordingly, it may be possible not only to achieve various effects according to use of the lead 142, which has a wire shape, but also to enhance the attachment force of the lead 142 through adjustment of the edge distance D.

Since the width W1 of the lead 142 is 250 to 500 μm, the edge distance D may have a value of 2.37 to 21.94 mm. For example, when the width W1 of the lead 142 is equal to or greater than 250 μm, but less than 300 μm, the edge distance D may be 2.37 to 9.78 mm. When the width W1 of the lead 142 is equal to or greater than 300 μm, but less than 350 μm, the edge distance D may be 3.99 to 12.94 mm. When the width W1 of the lead 142 is equal to or greater than 350 μm, but less than 400 μm, the edge distance D may be 5.06 to 15.98 mm. When the width W1 of the lead 142 is equal to or greater than 400 μm, but less than 450 μm, the edge distance D may be 5.69 to 18.96 mm. When the width W1 of the lead 142 is equal to or greater than 450 μm, but not greater than 500 μm, the edge distance D may be 5.94 to 21.94 mm. In the above-described ranges, Expression 2 is satisfied and, as such, superior attachment force may be provided.

For example, when the width W1 of the lead 142 is equal to or greater than 250 μm, but less than 300 μm, the edge distance D may be 4 to 9.78 mm. When the width W1 of the lead 142 is equal to or greater than 300 μm, but less than 350 μm, the edge distance D may be 6 to 12.94 mm. When the width W1 of the lead 142 is equal to or greater than 350 μm, but less than 400 μm, the edge distance D may be 9 to 15.98 mm. When the width W1 of the lead 142 is equal to or greater than 400 µm, but less than 450 µm, the edge distance D may be 10 to 18.96 mm. When the width W1 of the lead 142 is equal to or greater than 450 µm, but not greater than 500 µm, the edge distance D may be to 21.94 mm. In the above-described ranges, sufficient attachment force may be more stably provided. For example, in this embodiment, when the width W1 of the lead 142 is equal to or greater than 350 µm, but less than 400 µm, the edge distance D may be 9 to 15.98 mm. In this instance, the output power of the solar cell panel 100 may be maximized. Of course, the embodiment of the present invention is not limited to the above-described conditions.

In this embodiment, the edge distance D between each first pad section 422a and a corresponding one of the first and second edges 161 and 162 may satisfy the above Expression 2 because the first pad section 422a is arranged at the corresponding end of the bus bar line 42b where the lead 142 is disposed.

Figure 12:
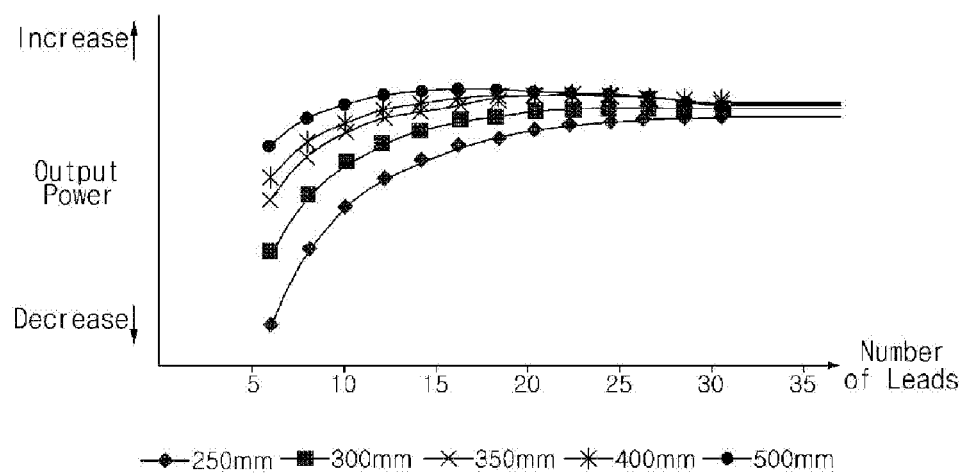
FIG. 12 is a diagram depicting outputs of the solar cell panel measured while varying the width of each lead and the number of leads.

The inventors also found that the number of leads 142 (the number of bus bar lines 42b) arranged at one surface of the solar cell 150 relates to the width W1 of each lead 142. FIG. 12 is a diagram depicting outputs of the solar cell panel 100 measured while varying the width of each lead 142 and the number of leads 142. Referring to FIG. 12, it may be found that, when 6 to 33 leads 142 having a width W1 of 250 to 500 µm are provided, the output power of the solar cell panel 100 exhibits a superior value. In this instance, it may be found that, when the width W1 of each lead 142 increases, the required number of leads 142 may be reduced.

For example, when the width W1 of the lead 142 is equal to or greater than 250 µm, but less than 300 µm, the number of leads 142 (with reference to one surface of the solar cell 150) may be 15 to 33. When the width W1 of the lead 142 is equal to or greater than 300 µm, but less than 350 µm, the number of leads 142 may be 10 to 33. When the width W1 of the lead 142 is equal to or greater than 350 µm, but less than 400 µm, the number of leads 142 may be 8 to 33. When the width W1 of the lead 142 is equal to or greater than 400 µm, but not greater than 500 µm, the number of leads 142 may be 6 to 33. Meanwhile, when the width W1 of the lead 142 is equal to or greater than 350 µm, it may be difficult to further increase the output power of the solar cell panel 100 even though the number of leads 142 exceeds 15. When the number of leads 142 increases, load on the solar cell 150 may be increased. In this regard, when the width W1 of the lead 142 is equal to or greater than 350 µm, but less than 400 µm, the number of leads 142 may be 8 to 15. In addition, when the width W1 of the lead 142 is equal to or greater than 400 µm, but not greater than 500 µm, the number of leads 142 may be 6 to 15. In order to further enhance the output power of the solar cell panel 100, the number of leads 142 may be equal to or greater than 10 (for example, 12 to 13). Of course, the embodiment of the present invention is not limited to the above-described conditions and, the number of leads 142 and the number of bus bar lines 42b may have various values.

Meanwhile, the pitch of leads 142 (or the pitch of bus bar lines 42b) may be 4.75 to 26.13 mm. This pitch is determined, taking into consideration the width W1 of each lead 142 and the number of leads 142. For example, when the width W1 of the lead 142 is equal to or greater than 250 µm, but less than 300 µm, the pitch of leads 142 may be 4.75 to 10.45 mm. When the width W1 of the lead 142 is equal to or greater than 300 µm, but less than 350 µm, the pitch of leads 142 may be 4.75 to 15.68 mm. When the width W1 of the lead 142 is equal to or greater than 350 µm, but less than 400 µm, the pitch of leads 142 may be 4.75 to 19.59 mm. When the width W1 of the lead 142 is equal to or greater than 400 µm, but not greater than 500 µm, the pitch of leads 142 may be 10.45 to 26.13 mm. For example, when the width W1 of the lead 142 is equal to or greater than 350 µm, but less than 400 µm, the pitch of leads 142 may be 10.45 to 19.59 mm. When the width W1 of the lead 142 is equal to or greater than 400 µm, but not greater than 500 µm, the pitch of leads 142 may be 10.45 to 26.13 mm. Of course, the embodiment of the present invention is not limited to the above-described conditions, and the pitch of leads 142 and the pitch of bus bar lines 42b may have various values.

In this embodiment, the first electrode 42, leads 142, electrode area EA, edge area PA, etc., may be symmetrically arranged in a lateral direction (a direction parallel to the finger lines 42a) and a vertical direction (a direction parallel to the bus bar lines 42b or leads 142). In accordance with this arrangement, stable current flow may be achieved. Of course, the embodiment of the present invention is not limited to the above-described arrangement.

The above description has been given mainly in conjunction with the first electrode 42 with reference to FIGS. 9 to 12. The second electrode 44 may include finger lines, bus bar lines and edge lines respectively corresponding to the finger lines 42a, bus bar lines 42b and edge lines 42c of the first electrode 42. The descriptions given of the finger lines 42a, bus bar lines 42b and edge lines 42c of the first electrode 42 may be applied to the finger lines, bus bar lines and edge lines of the second electrode 44 in a corresponding manner. As such, the description given of the first-conduction-type conductive region 20 associated with the first electrode 42 may be applied to the second-conduction-type conductive region 30 associated with the second electrode in a corresponding manner. The description given of the first passivation film 22, anti-reflective film 24 and openings 102 associated with the first electrode 42 may be applied to the second passivation film 30 and openings 104 associated with the second electrode 44 in a corresponding manner.

The width, pitch, number, etc., of finger lines 44a, the widths of line and pad sections of bus bar lines 44b and the pitch, number, etc., of the bus bar lines 44b in the second electrode 44 may be equal to the width, pitch, number, etc., of finger lines 42a, the widths of the line and pad sections 421 and 422 of the bus bar lines 42b and the pitch, number, etc., of the bus bar lines 42b in the first electrode 42, respectively. Alternatively, the width, pitch, number, etc., of finger lines 44a, the widths of line and pad sections of bus bar lines 44b and the pitch, number, etc., of the bus bar lines 44b in the second electrode 44 may differ from the width, pitch, number, etc., of finger lines 42a, the widths of the line and pad sections 421 and 422 of the bus bar lines 42b and the pitch, number, etc., of the bus bar lines 42b in the first electrode 42, respectively. For example, the electrode sections of the second electrode 44, upon which a relatively small amount of light is incident, may have a greater width than the corresponding electrode sections of the first electrode 42 and a smaller pitch than the corresponding electrode sections of the first electrode 42. Other variations are possible. Of course, the number and pitch of the bus bar lines 42b in the first electrode 42 may be equal to those of the second electrode 44. In addition, the second electrode 44 may have a planar shape different from that of the first electrode 42. Other variations are possible. For example, the length of each pad section 422 disposed at the back surface of the semiconductor substrate 160 may be greater than the length of each pad section 422 disposed at the front surface of the semiconductor substrate 160. This is because it is difficult for the pad section 422 disposed at the front surface of the semiconductor substrate 160 to have a great length, taking shading loss into consideration, whereas relatively small shading loss occurs at the back surface of the semiconductor substrate 160.

In accordance with this embodiment, it may be possible to minimize shading loss through diffuse reflection, using the wire-shaped leads 142. It may also possible to reduce the movement path of carriers by reducing the pitch of the leads 142. Accordingly, efficiency of the solar cell 150 and output power of the solar cell panel 100 may be enhanced. In addition, it may be possible to enhance attachment force between each wire-shaped lead 142 and the first electrode 42 by defining the edge distance D of the first pad section 422a in accordance with the width of the lead 142. Accordingly, damage to the solar cell 150 or the like, which may occur due to separation of the lead 142 from the first electrode 42, may be prevented and, as such, the solar cell 150 may have superior electrical characteristics and reliability. In addition, it may be possible to maximize output power of the solar cell panel 100 by defining the number of leads 142 in accordance with the width W1 of each lead 142.

In this embodiment, each of the electrode portions 424a and 424b respectively disposed at the first and second end edge areas PA3 and PA4 are disposed at a position flush with corresponding ones of the outermost finger lines 421a and 421b or a position outwards of the corresponding outermost finger lines 421a or 421b and, as such, may stably form a connection structure to the corresponding lead 142. It may be possible to effectively transfer current generated at portions of the electrode areas EA respectively disposed adjacent to the first and second end edge areas PA3 and PA4 to the lead 142 via the electrode portions 424a and 424b respectively disposed at the first and second end edge areas PA3 and PA4. Accordingly, current generated at portions of the electrode areas EA respectively disposed adjacent to the first and second end edge areas PA3 and PA4 may be effectively transferred to the lead 142 by the electrode portions 424a and 424b. Thus, even when the first edge areas PA1 (or the first and second end edge areas PA3 and PA4) are provided to achieve an enhancement in the attachment force or coupling force of the leads 142, it may be possible to avoid an efficiency reduction that may be caused by the provision of the first edge areas PA1. Thus, the efficiency of the solar cell 150 may be enhanced and, as such, the output power of the solar cell panel 100 may be enhanced. Accordingly, the efficiency of the solar cell 150 may be enhanced and, as such, the output power of the solar cell panel 100 may be enhanced.

In addition, the electrode portion 424a disposed at the first end edge area PA3 and the electrode portion 424b disposed at the second end edge area PA4 may have different shapes and, as such, it may be possible to simplify the electrode structures of the electrode portions 424a and 424b while stably forming the connection structures of the electrode portions 424a and 424b to the lead 142.

Hereinafter, a solar cell according to another embodiment of the present invention and a solar cell panel including the same will be described with reference to the accompanying drawings. The above description may be applied to parts identical or similar to those described above in the same manner and, as such, no description will be given of the identical or similar parts, and only parts different from those described above will be described in detail. Combinations of the above-described embodiment, variations thereof, the following embodiment and variations of the following embodiment also fall within the scope of the present invention. Although the following description is given in conjunction with, for example, the first electrode, the following illustration and explanation may also be applied to the second electrode in the same manner.

FIG. 13 is a plan view illustrating a portion of the front surface of a solar cell according to another embodiment of the present invention. (a) of FIG. 13 illustrates the first end edge area PA3 of the solar cell, and (b) of FIG. 13 illustrates the second end edge area PA4 of the solar cell.

Referring to (a) of FIG. 13, the second electrode part 4242 in the first end edge area PA3 protrudes farther toward the first edge 161 than the corresponding outermost finger lines 421a. Accordingly, the connection area or connection reliability of the second electrode part 4242 to the corresponding lead 142 may be further increased.

Referring to (b) of FIG. 13, the third electrode part 4243 in the second end edge area PA4 may protrude farther toward the second edge 162 than the corresponding outermost finger lines 421b. That is, the third electrode part 4243 may have a shape protruding outwards of the outermost finger lines 421b while being connected to the outermost finger lines 421b. In this embodiment, for example, the third electrode part 4243 is illustrated as being parallel to the outermost finger lines 421b at a central region thereof while being inclined from the outermost finger lines 422a at opposite ends thereof. Of course, the embodiment of the present invention is not limited to the above-described shape, and the third electrode part 4243 may have various shapes.

FIG. 14 is a plan view illustrating a portion of the front surface of a solar cell according to another embodiment of the present invention.

Referring to FIG. 14, the third electrode part 4243 may have a greater thickness than the corresponding outermost finger lines 421b and, as such, the outer edge of the third electrode part 4243 may have a shape protruding toward the second edge 162 beyond the outermost finger lines 421b. When the third electrode part 4243 has a relatively great thickness, as described above, it may be possible to increase the connection area of the third electrode part 4243 to the lead 142 in the second end edge area PA4.

FIG. 15 is a plan view illustrating a portion of the front surface of a solar cell according to another embodiment of the present invention.

Referring to FIG. 15, the third electrode part 4243 is illustrated as having a greater thickness than the corresponding outermost finger lines 421b while having an outer edge disposed to be flush with the outermost finger lines 421b and an inner edge disposed inwards of the outermost finger lines 422a. When the third electrode part 4243 has a relatively great thickness, as described above, it may be possible to increase the connection area of the third electrode part 4243 to the lead 142 in the second end edge area PA4.

Figure 16:
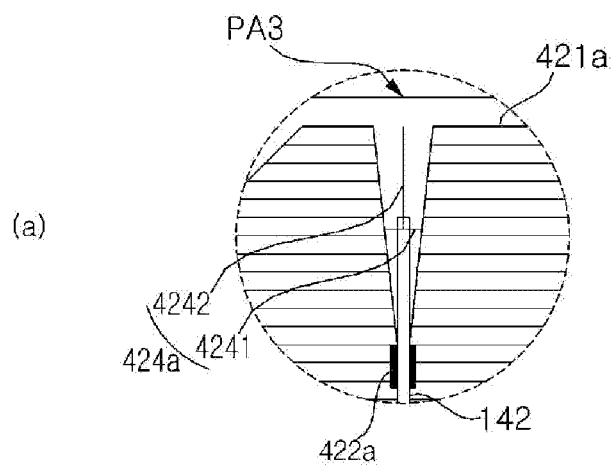
FIG. 16 is a plan view illustrating a portion of the front surface of a solar cell according to another embodiment of the present invention.
Figure 16:
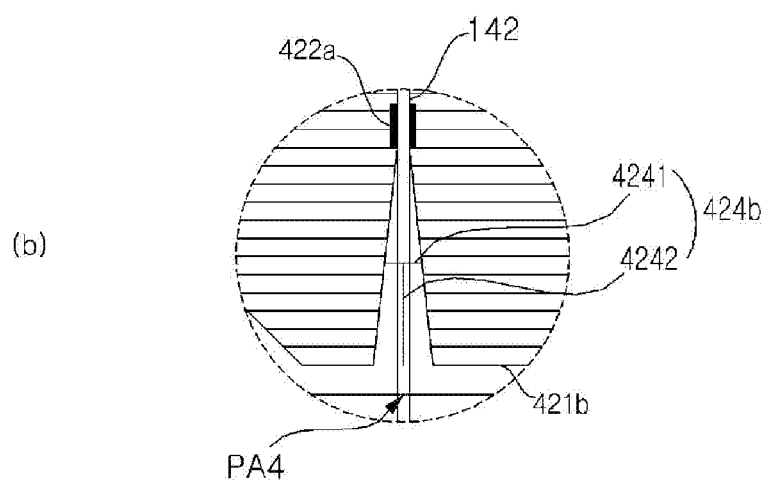

FIG. 16 is a plan view illustrating a portion of the front surface of a solar cell according to another embodiment of the present invention.

Referring to (a) and (b) of FIG. 16, in this embodiment, the electrode portion 424a disposed at the first end edge area PA3 and the electrode portion 424b disposed at the second end edge area PA4 may have symmetrical shapes. For example, the electrode portion 424a disposed at the first end edge area PA3 and the electrode portion 424b disposed at the second end edge area PA4 may be symmetrical with reference to a virtual line parallel to the finger lines 42a while passing through the center of the solar cell 150. Accordingly, the opening of the electrode portion 424a disposed at the first end edge area PA3 and the opening of the electrode portion 424b disposed at the second end edge area PA4 may also have symmetrical shapes or arrangement.

For example, referring to (a) of FIG. 16, the electrode portion 424a in the first end edge area PA3 may include a first electrode part 4241 disposed inwards of the corresponding outermost finger lines 421a, and a second electrode part 4242 extending from the first electrode part 4241 to a position flush with the outermost finger lines 421a or a position outwards of the outermost finger lines 421a in a direction crossing the first electrode part 4241. The shape of the electrode portion 424a in the first end edge area PA3 is identical or very similar to the shape of the electrode portion 424a in the first end edge area PA3 described with reference to FIG. 9 and, as such, no detailed description thereof will be given.

Meanwhile, referring to (b) of FIG. 16, the electrode portion 424b in the second end edge area PA4 may include a first electrode part 4241 disposed inwards of the corresponding outermost finger lines 421b, and a second electrode part 4242 extending from the first electrode part 4241 to a position flush with the outermost finger lines 421b or a position outwards of the outermost finger lines 421b in a direction crossing the first electrode part 4241. The shape of the electrode portion 424b in the second end edge area PA4 is identical or very similar to the shape of the electrode portion 424a in the first end edge area PA3 described with reference to FIG. 9 and, as such, no detailed description thereof will be given.

Accordingly, the first electrode part 4241 disposed at the first end edge area PA3 and the first electrode part 4241 disposed at the second end edge area PA4 are arranged at symmetrical positions, respectively, while having the same or very similar shapes, lengths and widths. In addition, the second electrode part 4242 disposed at the first end edge area PA3 and the second electrode part 4242 disposed at the second end edge area PA4 are arranged at symmetrical positions, respectively, while having the same or very similar shapes, lengths and widths.

Of course, the embodiment of the present invention is not limited to the above-described conditions. For example, although the electrode portion 424a disposed at the first end edge area PA3 and the electrode portion 424b disposed at the second end edge area PA4 are arranged at symmetrical positions, respectively, the shapes, lengths and widths thereof may differ from each other. Alternatively, although the electrode portion 424a disposed at the first end edge area PA3 and the electrode portion 424b disposed at the second end edge area PA4 are not arranged at accurately symmetrical positions, respectively, at least one of the shapes, lengths and widths thereof may be the same or very similar. Other variations are possible.

In this embodiment, simplification of the structure and uniform flow of current may be achieved because the electrode portion 424a disposed at the first end edge area PA3 and the electrode portion 424b disposed at the second end edge area PA4 are formed to be symmetrical.

FIG. 16 illustrates each of the electrode portions 424a and 424b disposed at the first and second end edge areas PA3 and PA4 as including the first and second electrode parts 4241 and 4242. However, the embodiment of the present invention is not limited to the above-described structure. The electrode portions 424a and 424b disposed at the first and second end edge areas PA3 and PA4 may have various shapes. This will be described with reference to FIG. 17.

Figure 17:
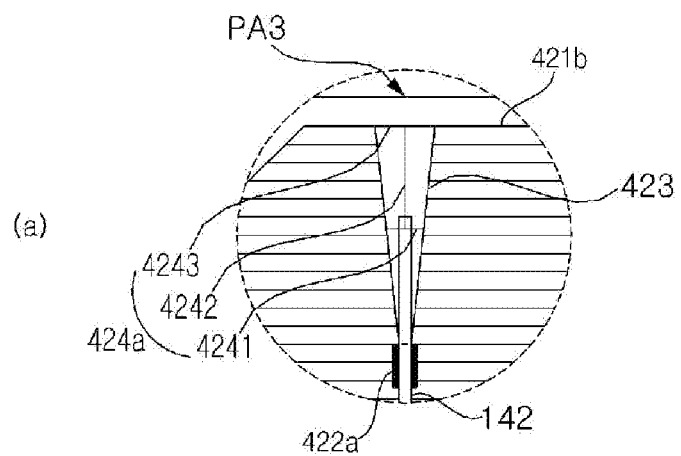
FIG. 17 is a plan view illustrating a portion of the front surface of a solar cell according to another embodiment of the present invention.
Figure 17:
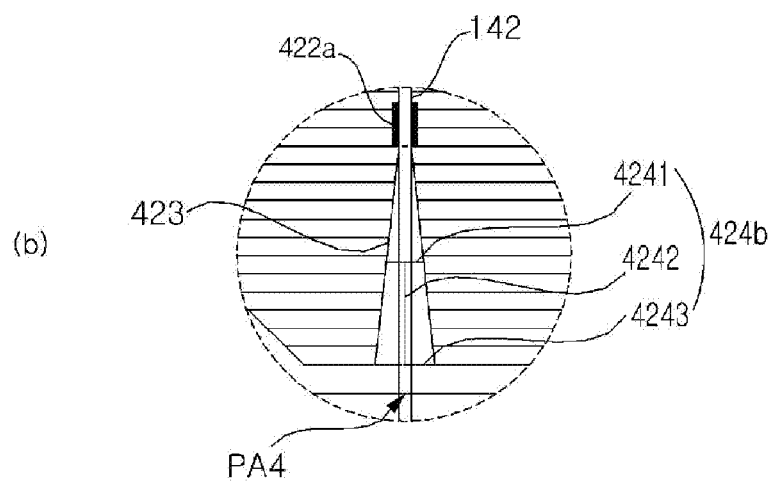

FIG. 17 is a plan view illustrating a portion of the front surface of a solar cell according to another embodiment of the present invention.

Referring to (a) and (b) of FIG. 17, in this embodiment, the electrode portion 424a disposed at the first end edge area PA3 and the electrode portion 424b disposed at the second end edge area PA4 may have symmetrical shapes, as illustrated in FIG. 16.

For example, referring to (a) of FIG. 17, the electrode portion 424a in the first end edge area PA3 may include a first electrode part 4241 disposed inwards of the corresponding outermost finger lines 421a, a second electrode part 4242 extending from the first electrode part 4241 to a position flush with the outermost finger lines 421a or a position outwards of the outermost finger lines 421a in a direction crossing the first electrode part 4241, and a third electrode part 4243 disposed at a position flush with the outermost finger lines 421a or a position outwards of the outermost finger lines 421a. The second electrode part 4242 may reach the third electrode part 4243 and, as such, may be connected to the third electrode part 4243. In addition, the third electrode part 4243 may connect the outermost finger lines 421a disposed at opposite sides of the first end edge area PA3.

In addition, referring to (b) of FIG. 17, the electrode portion 424b in the second end edge area PA4 may include a first electrode part 4241 disposed inwards of the corresponding outermost finger lines 421b, a second electrode part 4242 extending from the first electrode part 4241 to a position flush with the outermost finger lines 421b or a position outwards of the outermost finger lines 421b in a direction crossing the first electrode part 4241, and a third electrode part 4243 disposed at a position flush with the outermost finger lines 421b or a position outwards of the outermost finger lines 421b. The second electrode part 4242 may reach the third electrode part 4243 and, as such, may be connected to the third electrode part 4243. In addition, the third electrode part 4243 may connect the outermost finger lines 421b disposed at opposite sides of the second end edge area PA4.

In this embodiment, openings are formed in a closed space defined by the first electrode part 4241, second electrode part 4242, third electrode part 4243 and extension sections 423 in each of the first and second end edge area PA3 and PA4. For example, two openings may be provided between the extension sections 423 at opposite sides of the second electrode part 4242, respectively, and one opening may be provided among the first electrode part 4241 and extension sections 423.

As illustrated in FIG. 17, the first electrode part 4241 disposed at the first end edge area PA3 and the first electrode part 4241 disposed at the second end edge area PA4 are arranged at symmetrical positions, respectively, while having the same or very similar shapes, lengths and widths. In addition, the second electrode part 4242 disposed at the first end edge area PA3 and the second electrode part 4242 disposed at the second end edge area PA4 may be arranged at symmetrical positions, respectively, while having the same or very similar shapes, lengths and widths. In addition, the third electrode part 4243 disposed at the first end edge area PA3 and the third electrode part 4243 disposed at the second end edge area PA4 may be arranged at symmetrical positions, respectively, while having the same or very similar shapes, lengths and widths.

Of course, the embodiment of the present invention is not limited to the above-described arrangements. For example, although the electrode portion 424a disposed at the first end edge area PA3 and the electrode portion 424b disposed at the second end edge area PA4 are arranged at symmetrical positions, respectively, the shapes, lengths and widths thereof may differ from each other. Alternatively, although the electrode portion 424*a* disposed at the first end edge area PA3 and the electrode portion 424*b* disposed at the second end edge area PA4 are not arranged at accurately symmetrical positions, respectively, at least one of the shapes, lengths and widths thereof may be the same or very similar. Other variations are possible.

Detailed descriptions of the first to third electrode parts 4241, 4242, and 4243 are identical or very similar to those of the first to third electrode parts 4241, 4242, and 4243 given with reference to FIG. 9 and, as such, may not be given. The present invention may further include an embodiment in which the electrode portion 424*a* disposed at the first end edge area PA3 in the instance of FIG. 9 has the shape illustrated in (a) of FIG. 17.

In this embodiment, each of the electrode portions 424*a* and 424*b* respectively disposed at the first and second end edge areas PA3 and PA4 includes the first to third electrode parts 4241, 4242, and 4243 and, as such, various current paths are provided. Accordingly, current may more smoothly flow.

Figure 18:
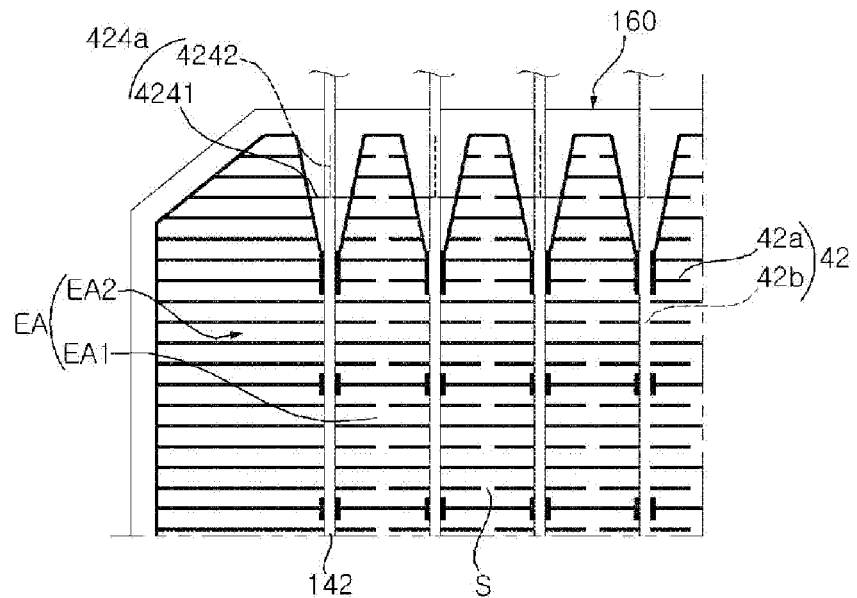
FIG. 18 is a plan view illustrating a portion of the front surface of a solar cell according to another embodiment of the present invention.

FIG. 18 is a plan view illustrating a portion of the front surface of a solar cell according to another embodiment of the present invention.

Referring to FIG. 18, the solar cell may include line breaking sections S, at which finger lines 42*a* arranged between two neighboring bus bar lines 42*b* are broken at respective parts thereof without extending continuously.

In this instance, the line breaking sections S may be formed at the finger lines 42*a* arranged in the first electrode areas EA1, respectively, and may not be formed at the finger lines 42*a* arranged in the second electrode areas EA2. Although the finger lines 42*a* in each first electrode area EA1 have respective line breaking sections S, current may smoothly flow through the finger lines 42*a* because the finger lines 42*a* are connected to two neighboring bus bar lines 42*b* or leads 142 at opposite sides thereof. In this instance, accordingly, it may be possible to reduce the area of the first electrode 42 without obstructing flow of current in the first electrode area EA1 and, as such, manufacturing costs and shading loss may be reduced. On the other hand, the finger lines 42*a* in each second electrode area EA2 are connected to one bus bar line 42*b* or lead 142 only at one side thereof, and have no line breaking section S and, as such, current may smoothly flow to the bus bar line 42*b* or lead 142 disposed at one side of the finger lines 42*a*.

The line breaking sections S of the finger lines 42*a* in each first electrode area EA1 may be centrally arranged between two neighboring bus bar lines 42*b* corresponding to the first electrode area EA1. Accordingly, it may be possible to minimize a current movement path.

The width of each line breaking section S may be 0.5 times or more the pitch of each finger line 42*a*, and may be 0.5 times or less the pitch of each bus bar line 42*b*. When the width of each line breaking section S is less than 0.5 times the pitch of each finger line 42*a*, effects of the line breaking section S may be insufficient because the line breaking section S is too narrow. On the other hand, when the width of each line breaking section S is greater than 0.5 times the pitch of each bus bar line 42*b*, electrical characteristics may be degraded because the line breaking section S is too wide. For example, the width of the line breaking section S may be 1.5 to 3.2 mm. Meanwhile, for example, the width of each line breaking section S may be greater than the width W6 of each pad section 422 in each bus bar line 42*b*. Within this range, effects of the line breaking section S may be maximized. Of course, the embodiment of the present invention is not limited to the above-described conditions, and the width of each line breaking section S may have various values.

The ratio of the number of finger lines 42*a* having line breaking sections S in each first electrode area EA1 may be 0.33 to 1 times the total number of finger lines 42*a* in the first electrode area EA1 when the numbers of the finger lines 42*a* are measured in a direction parallel to the bus bar lines 42*b*. Within this range, effects of the line breaking section S may be maximized. Of course, the embodiment of the present invention is not limited to the above-described conditions, and the above-described number ratio may be varied.

Although the line breaking sections S are illustrated in FIG. 18 as being provided at each first electrode area EA1, the embodiment of the present invention is not limited thereto. The line breaking sections S may be provided at a part of the plurality of first electrode areas EA1, and may not be provided at the remaining part of the plurality of first electrode areas EA1. Alternatively, a plurality of line breaking sections S (for example, two or more line breaking sections S) may be provided at each finger line 42*a*. In addition, positions of the line breaking sections S in one finger line 42*a* may differ from those of another finger line 42*a*. Although the line breaking sections S are illustrated in FIG. 18 as being provided at the first electrode areas EA1 without being provided at the second electrode areas EA2, the embodiment of the present invention is not limited thereto. For example, the line breaking sections S may be provided at both the first electrode areas EA1 and the second electrode areas EA2. In the drawings and above description, although illustration and description has been given in conjunction with the first electrode 42, the description may be applied to the second electrode 44 in the same manner.

Figure 19:
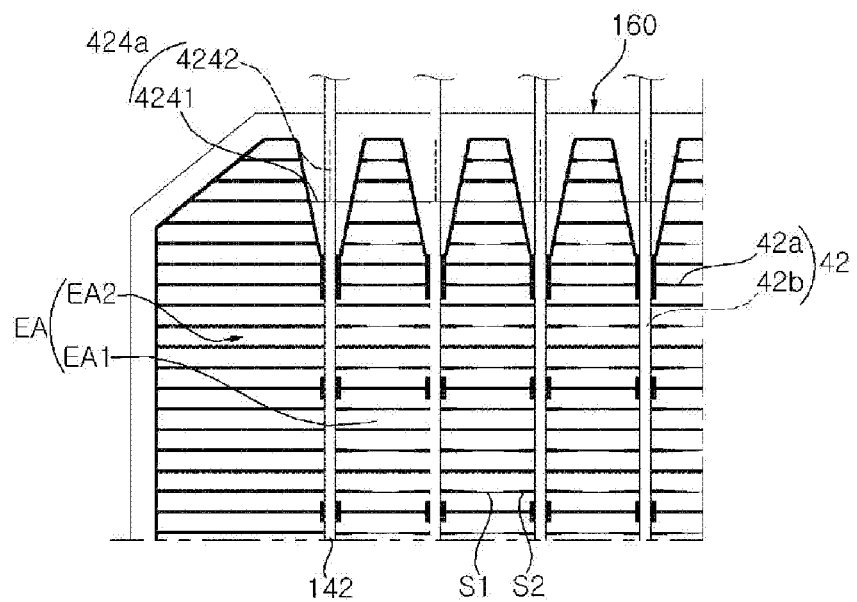
FIG. 19 is a plan view illustrating a portion of the front surface of a solar cell according to another embodiment of the present invention.

FIG. 19 is a plan view illustrating a portion of the front surface of a solar cell according to another embodiment of the present invention.

Referring to FIG. 19, the solar cell may include finger lines 42*a* each arranged between two neighboring bus bar lines 42*b* while having portions having different line widths. Each of the finger lines 42*a* may include a narrow portion S1 having a relatively small width, and a wide portion S2 having a relatively great width.

For example, in this embodiment, each of the finger lines 42*a* arranged in each first electrode area EA1 may include a narrow portion S1 and a wide portion S2, and each of the finger lines 42*a* arranged in each second electrode area EA2 has a uniform width (for example, a width equal to that of the wide portion S2). In the first electrode area EA1, current may smoothly flow because the finger lines 42*a* are connected between two neighboring bus bar lines 42*b* or leads 142. Accordingly, it may be possible to reduce the area of the first electrode 42 by virtue of the narrow portions S1 of the first electrode 42 without obstructing flow of current and, as such, manufacturing costs and shading loss may be reduced. On the other hand, in the second electrode area EA2, the finger lines 42*a* are connected to one bus bar line 42*b* or lead 142 only at one side thereof, and have a uniform width because no narrow portion S1 is provided and, as such, current may flow to the bus bar line 42*b* or lead 142 disposed at one side of the finger lines 42*a*.

In this embodiment, the narrow portions S1 of the finger lines 42*a* may be centrally arranged between two neighboring bus bar lines 42*b*, and the finger lines 42*a* may have a width gradually increasing toward the two neighboring bus bar lines 42*b*. Accordingly, smooth current flow may be achieved. Of course, the embodiment of the present invention is not limited to the above-described conditions, and the finger lines 42a each having the narrow portion S1 and wide portion S2 may have various shapes.

The ratio of the number of finger lines 42a having narrow portions S1 in each first electrode area EA1 may be 0.33 to 1 times the total number of finger lines 42a in the first electrode area EA1 when the numbers of the finger lines 42a are measured in a direction parallel to the bus bar lines 42b. Within this range, effects of the line breaking section S may be maximized.

Although the narrow portions S1 are illustrated in FIG. 19 as being provided at each first electrode area EA1, the embodiment of the present invention is not limited thereto. The narrow portions S1 may be provided at a part of the plurality of first electrode areas EA1, and may not be provided at the remaining part of the plurality of first electrode areas EA1. Alternatively, a plurality of narrow portions S1 (for example, two or more narrow portions S1) may be provided at each finger line 42a. In addition, positions of the narrow portions S1 in one finger line 42a may differ from those of another finger line 42a. Although the narrow portions S1 are illustrated in FIG. 18 as being provided at the first electrode areas EA1 without being provided at the second electrode areas EA2, the embodiment of the present invention is not limited thereto. For example, the narrow portions S1 may be provided at both the first electrode areas EA1 and the second electrode areas EA2. In addition, in the above-described modified embodiments, the line breaking section S illustrated in FIG. 18 may be provided in combination with the narrow portion S1. In the drawings and above description, although illustration and description has been given in conjunction with the first electrode 42, the description may be applied to the second electrode 44 in the same manner.

Hereinafter, the present invention will be described in more detail with reference to an experimental example according to the present invention. The following experimental example is only illustrative for reference and, as such, the embodiment of the present invention is not limited thereto.

EXPERIMENTAL EXAMPLE

A lead having a circular cross-section and a width of 300 μm was attached to a solar cell having an edge distance of 7.5 mm. Attachment force was then measured while pulling the lead using an experimental device (for example, a tensile testing device). The measured values of attachment force are depicted in FIG. 20.

Figure 20:
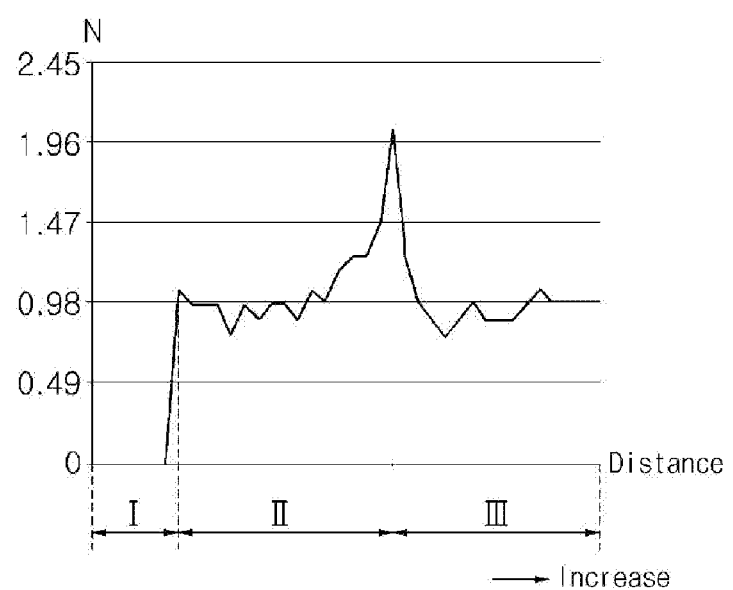
FIG. 20 is a graph depicting measured results of attachment force measured while pulling a lead attached to a solar cell panel using an experimental device.

In FIG. 20, the horizontal axis represents distance, and the vertical axis represents attachment force. The horizontal axis may be divided into three sections. The first section, for example, a section I, is a section in which pulling of the lead is begun, and is continued before the lead is tightened. The second section, for example, a section II, is a section in which the lead is actually tightened by the experimental device in accordance with pulling. The third section, for example, a section III, is a section in which the lead is detached from pad sections. Accordingly, actual attachment force may be measured in the second section II.

In the first section I, no actual force is applied to the lead because the first section I is a small-distance section.

In the second section II, the experimental device continuously pulls the lead. Accordingly, as the distance in the second section II increases, stress applied to the lead is increased in proportion to distance. Thus, the graph in FIG. 16 depicts a gradual increase of an attachment force towards an apex. For example, the attachment force gradually increases in the second section II, and then abruptly decreases after passing an apex of 2.058N.

The third section III is a section following the apex of the attachment force. In the third section III, stress applied to the lead is abruptly reduced because the lead is detached from first pad sections.

It may be seen that the attachment force of the lead according to this embodiment exhibits a superior value of 2.058N.

The features, structures, effects, etc., as described above are included in at least one embodiment, and are not limited to a particular embodiment. In addition, although the example embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell panel comprising:
   a solar cell comprising a semiconductor substrate, a conductive region formed in or on the semiconductor substrate, and an electrode connected to the conductive region; and
   a plurality of lead wires electrically connected to the electrode, to connect the solar cell to another solar cell,
   wherein the electrode comprises:
      a plurality of finger electrodes formed to extend in parallel in a first direction;
      busbar electrodes formed to extend in a second direction crossing the first direction and each including a plurality of pad sections and a line section connecting to the plurality of pad sections in the second direction; and
      a first additional electrode formed at a first edge area between a first outermost pad section among the plurality of pad sections and a first outermost finger electrode among the plurality of finger electrodes, wherein the first additional electrode includes a first part extending in the first direction and a second part extending in the second direction,
   wherein each of the plurality of lead wires is overlapped with the line section and is positioned at the first edge area to be overlapped with at least a part of the first additional electrode,
   wherein each of the plurality of lead wires has a width greater than a width of the line section, wherein the plurality of the finger electrodes extending in the first direction within the first edge area are cut from each other in the first direction, and the busbar electrodes are not formed outside the first outermost pad section, and
   wherein a number of the plurality of pad sections is less than a number of intersections of the plurality of finger electrodes and the busbar electrodes.

2. The solar cell panel according to claim 1, wherein a couple force between the first additional electrode and the plurality of lead wires in the first edge area is less than a couple force between the busbar electrodes and the plurality of lead wires in areas other than the first edge area.

3. The solar cell panel according to claim 1, wherein:
   the first edge area is disposed at a first side of each of the busbar electrodes in the second direction,
   the first additional electrode is connected to corresponding ones of the plurality of finger electrodes, the corresponding ones of the plurality of finger electrodes being arranged in two opposite electrode areas disposed adjacent to the first edge area, and the electrode further comprises a second additional electrode formed at a second edge area between a second outermost pad section among the plurality of pad sections and a second outermost finger electrode among the plurality of finger electrodes at a second side of each of the busbar electrodes opposite to the first side in the second direction, the second additional electrode includes a third part extending in the first direction, and the third part is connected to other corresponding ones of the plurality of finger electrodes, the other corresponding ones of the plurality of finger electrodes being arranged in two opposite electrode areas disposed adjacent to the second edge area.

4. The solar cell panel according to claim 1, wherein:

the electrode further comprises a second additional electrode formed at a second edge area between a second outermost pad section among the plurality of pad sections and a second outermost finger electrode among the plurality of finger electrodes at a second side of each of the busbar electrodes opposite to the first side in the second direction, an end of each of the plurality of lead wires is disposed within the first edge area, each of the plurality of lead wires extends from the end to the another solar cell while passing through the second edge area, and the first additional electrode disposed at the first edge area and the second electrode disposed at the second edge area have different shapes, respectively.

5. The solar cell panel according to claim 4, wherein:

the first part is disposed inwards of the first outermost finger electrode among the plurality of finger electrodes, and the second part extends from the first part to a position flush with the first outermost finger electrode or a position outward of the first outermost finger electrode in the second direction;

the third part is disposed at a position flush with the second outermost finger electrode among the plurality of finger electrodes or a position outward of the second outermost finger electrode;

at least one of the plurality of lead wires is disposed at the first and second parts in the first edge area; and the at least one of the plurality of lead wires is disposed at a third part in the second edge area.

6. The solar cell panel according to claim 5, wherein:

the first part and the third part are parallel to the plurality of finger electrodes;

the second part perpendicularly crosses the plurality of finger electrodes;

the second part is arranged to pass through a center of the first part;

the at least one of the plurality of lead wires is arranged to cross the first part such that the end of the at least one of the plurality of lead wires is disposed on the second part; and the at least one of the plurality of lead wires crosses the third part.

7. The solar cell panel according to claim 1, wherein:

the electrode further comprises a second additional electrode formed at a second edge area between a second outermost pad section among the plurality of pad sections and a second outermost finger electrode among the plurality of finger electrodes at a second side of each of the busbar electrodes opposite to the first side in the second direction;

an end of each of the plurality of lead wires is disposed within the first edge area;

each of the plurality of lead wires extends from the end to the another solar cell while passing through the second edge area; and the first addition electrode disposed at the first edge area and the second additional electrode disposed at the second edge area have symmetrical shapes, respectively.

8. The solar cell panel according to claim 1, wherein:

the first edge area comprises an inner end disposed inward of the first outermost finger electrode among the plurality of finger electrodes; and the first outermost pad section of the plurality of pad sections is disposed at the inner end.

9. The solar cell panel according to claim 8, wherein:

each of the plurality of pad sections has a width equal to or greater than a width of each of the plurality of lead wires; and the width of each of the plurality of pad sections is greater than a width each of the plurality of finger electrodes and a width of the line sections.

10. The solar cell panel according to claim 8, wherein each of the plurality of lead wires extends to the first edge area disposed outward of the first outermost pad section among the plurality of pad sections at the inner end of the first edge area.

11. The solar cell panel according to claim 1, wherein each of the plurality of lead wires has different lengths at portions thereof disposed at the first edge area and a second edge area located between a second outermost pad section among the plurality of pad sections and a second outermost finger electrode among the plurality of finger electrodes at a side of each of the busbar electrodes opposite to the first edge area in the second direction, respectively.

12. The solar cell panel according to claim 1, wherein:

the first edge area comprises an inner end disposed inward of the first outermost finger electrode among the plurality of finger electrodes; and when "W" represents a width of each of the plurality of lead wires, and "D" represents an edge distance between the inner end of the first edge area and a corresponding edge of the semiconductor substrate, "W" and "D" satisfy the following Expression:

$$13.732*\ln(W)-71.436-0.0000321462*(W)^2 \leq D \leq 13.732*\ln(W)-71.436+0.0000321462*(W)^2,$$  <Expression> where the unit of "W" is µm, and the unit of "D" is mm.

13. The solar cell panel according to claim 12, wherein:

the width of each of the plurality of lead wires is 250 to 500 µm;

the edge distance is 2.37 to 21.94 mm; and the plurality of lead wires comprises 6 to 33 leads arranged with reference to one surface of the solar cell.

14. The solar cell panel according to claim 1, wherein:

the first additional electrode has a width equal to or greater than a width of each of the plurality of finger electrodes, and is smaller than a pitch between adjacent pairs of the plurality of finger electrodes;

each of the plurality of lead wires has a greater width than the width of the first additional electrode; and the first outermost finger electrode comprises two first outermost finger electrodes arranged in two opposite electrode areas disposed adjacent to the first edge area, and the first edge area has a greater width between the two first outermost finger electrodes among the plurality of finger electrodes than the width of one of the plurality of lead wires.

15. The solar cell panel according to claim 1, wherein the first edge area has a shape having a width gradually increasing towards a corresponding edge of the semiconductor substrate.

16. The solar cell panel according to claim 1, further comprising:
- extension sections each arranged between the first edge area and an electrode area disposed adjacent to the first edge area, to divide the first edge area from the electrode area;
- two or more of the plurality of finger electrodes are connected to each of the extension sections; and
- the first additional electrode in the first edge area is connected to corresponding ones of the plurality of finger electrodes via the extension sections.

17. The solar cell panel according to claim 1, wherein a width of the first edge area is smaller than a length of the first edge area between the first outermost pad section and the first outermost finger electrode.

18. The solar cell panel according to claim 1, wherein the second part is connected to the first part and spaced apart from the busbar electrodes without directly contacting the busbar electrodes.

19. The solar cell panel according to claim 1, wherein a length of the first edge area between the first outermost pad section and the first outermost finger electrode is larger than a length of a portion of each lead wire disposed at the first edge area among the plurality of lead wires.

\* \* \* \* \*